United States Patent
Kim

(10) Patent No.: US 7,909,486 B2
(45) Date of Patent: Mar. 22, 2011

(54) LIGHT EMITTING DEVICE PACKAGE AND BACKLIGHT UNIT AND LIQUID CRYSTAL DISPLAY DEVICE USING THE SAME

(75) Inventor: Yong Suk Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 259 days.

(21) Appl. No.: 12/273,401

(22) Filed: Nov. 18, 2008

(65) Prior Publication Data

US 2010/0014281 A1    Jan. 21, 2010

(30) Foreign Application Priority Data

Jul. 17, 2008   (KR) .......................... 10-2008-0069651

(51) Int. Cl.
 *F21V 5/04* (2006.01)
 *G02F 1/13357* (2006.01)
 *H01L 33/00* (2010.01)
(52) U.S. Cl. ....... 362/335; 362/97.3; 362/326; 362/611; 257/98; 257/99; 257/100
(58) Field of Classification Search ................. 362/97.3, 362/326, 335, 611; 257/98, 99, 100
See application file for complete search history.

(56) References Cited

U.S. PATENT DOCUMENTS

| | | | |
|---|---|---|---|
| 6,972,439 B1 * | 12/2005 | Kim et al. | 257/98 |
| 7,385,653 B2 * | 6/2008 | Kim et al. | 349/61 |
| 7,499,228 B2 | 3/2009 | Jeong et al. | |
| 7,748,873 B2 * | 7/2010 | Kim et al. | 362/328 |
| 7,775,687 B2 * | 8/2010 | Nishi et al. | 362/329 |
| 2006/0083000 A1 * | 4/2006 | Yoon et al. | 362/311 |
| 2006/0138437 A1 * | 6/2006 | Huang et al. | 257/98 |
| 2006/0273337 A1 * | 12/2006 | Han et al. | 257/98 |
| 2007/0109952 A1 | 5/2007 | Jeong et al. | |
| 2008/0297918 A1 | 12/2008 | Park et al. | |
| 2010/0073937 A1 * | 3/2010 | Ho | 362/335 |

FOREIGN PATENT DOCUMENTS

| | | |
|---|---|---|
| JP | 2007-140524 A | 6/2007 |
| KR | 10-2006-0040502 A | 5/2006 |
| KR | 10-2008-0038669 A | 5/2008 |
| WO | WO-2007-021149 A1 | 2/2007 |

* cited by examiner

*Primary Examiner* — Stephen F Husar
*Assistant Examiner* — James W Cranson
(74) *Attorney, Agent, or Firm* — Birch, Stewart, Kolasch & Birch, LLP

(57) ABSTRACT

A light emitting device package and other devices using the light emitting device package are discussed. According to an embodiment, the light emitting device package includes a package body; at least one light emitting device disposed in the package body; at least one pair of leads electrically connected with the light emitting device; and a lens over the light emitting device and having at least one recess at an upper portion of the lens, the shortest distance from the light emitting device to a lowest portion of the recess being greater than approximately D1/7 and smaller than approximately D1/2.4, wherein D1 is a diameter of the lens.

21 Claims, 30 Drawing Sheets

Luminance

Luminance

D2=D1/2.5

Occurrence of Luminance Difference

LIGHT EMITTING DEVICE PACKAGE AND BACKLIGHT UNIT AND LIQUID CRYSTAL DISPLAY DEVICE USING THE SAME

This application claims the priority benefits of the Korean Patent Application No. 10-2008-0069651, filed on Jul. 17, 2008, which is hereby incorporated by reference as if fully set forth herein.

BACKGROUND OF THE INVENTION

1. Field of the Invention

The present invention relates to a light emitting device package, and a backlight unit and a liquid crystal display device each using the light emitting device package.

2. Discussion of the Related Art

A Liquid Crystal Display (LCD) device is a display device wherein data signals based on image information are individually applied to pixels arranged in a matrix to thereby regulate light transmissivity of the pixels, enabling display of desired images. Such an LCD device is generally designed to display images under the assistance of a backlight unit provided at a rear side thereof.

Recently, Light Emitting Diodes (LEDs) have been used as a light source for a backlight unit of an LCD. The application of a backlight unit using the LEDs is increasingly expanded to LCDs for laptop computers as well as cellular phones and the like.

Backlight units using the LEDs may be classified into a Light Guide Panel (LGP) type as shown in FIG. 1, and a direct type as shown in FIG. 2.

A light guide panel type backlight unit as shown in FIG. 1 is designed such that light emitted from an LED package 1 travels through a lateral side of a light guide panel 2, achieving luminance uniformity.

A direct type backlight unit as shown in FIG. 2 is designed such that LED packages 3 are located at regular intervals below a diffuser panel 4, achieving luminance uniformity. The direct type backlight unit typically includes an LED package having a viewing angle of 120°.

SUMMARY OF THE INVENTION

The present invention relates to a light emitting device package. The present invention further relates to a backlight unit and a liquid crystal display device each using the light emitting device package. The present invention still further relates to a liquid crystal display device using the light emitting device package or backlight unit.

In one embodiment, the light emitting device package comprises a package body, a light emitting device mounted on the package body, at least one pair of leads included in the package body and electrically connected with the light emitting device, and a lens located above the light emitting device of the package body and having a recess indented from an upper surface thereof and a curved upper surface defined around the recess to have at least one radius of curvature. The shortest distance from the light emitting device to the lowest portion of the recess is preferably greater than D1/7 and smaller than D1/2.4 wherein D1 is a diameter of the lens.

In another embodiment, the light emitting device package comprises a package body, a light emitting device mounted on the package body, at least one pair of leads included in the package body and electrically connected with the light emitting device, and a lens located above the light emitting device of the package body and having a recess indented from an upper surface thereof and a curved upper surface defined around the recess to have at least one radius of curvature. The radius of curvature of the curved upper surface of the lens is preferably greater than 0.8 mm and smaller than 1.8 mm.

A still further embodiment of a light emitting device package comprises a package body, a light emitting device mounted on the package body, at least one pair of leads electrically connected with the light emitting device, and a lens located above the light emitting device of the package body and having a recess indented from an upper surface thereof and a curved upper surface defined around the recess to have at least one radius of curvature. The shortest distance from the light emitting device to the lowest portion of the recess is preferably greater than D1/7 and smaller than D1/2.4 wherein D1 is a diameter of the lens, and the radius of curvature of the curved upper surface of the lens is preferably greater than 0.8 mm and smaller than 1.8 mm.

In one embodiment, a backlight unit comprises a light emitting device package, and a circuit board on which a plurality of the light emitting device packages are arranged and mounted. The light emitting device package includes a light emitting device mounted on a package body, and a lens located above the light emitting device of the package body and having a recess indented from an upper surface thereof and a curved upper surface defined around the recess to have at least one radius of curvature. The shortest distance from the light emitting device to the lowest portion of the recess is preferably greater than D1/7 and smaller than D1/2.4 wherein D1 is a diameter of the lens.

In another embodiment, the backlight unit comprises a light emitting device package, and a circuit board on which a plurality of the light emitting device packages are arranged and mounted. The light emitting device package includes a light emitting device mounted on a package body, and a lens located above the light emitting device of the package body and having a recess indented from an upper surface thereof and a curved upper surface defined around the recess to have at least one radius of curvature. The radius of curvature of the curved upper surface of the lens is preferably greater than 0.8 mm and smaller than 1.8 mm.

A still further embodiment of the backlight unit comprises a light emitting device package, and a circuit board on which a plurality of the light emitting device packages are arranged and mounted. The light emitting device package includes a light emitting device mounted on a package body, and a lens located above the light emitting device of the package body and having a recess indented from an upper surface thereof and a curved upper surface defined around the recess to have at least one radius of curvature. The shortest distance from the light emitting device to the lowest portion of the recess is preferably greater than D1/7 and smaller than D1/2.4 wherein D1 is a diameter of the lens, and the radius of curvature of the curved upper surface of the lens is preferably greater than 0.8 mm and smaller than 1.8 mm.

An embodiment of a liquid crystal display device comprises a backlight unit including a light emitting device mounted on a package body, a light emitting device package, and a circuit board on which a plurality of the light emitting device packages are arranged and mounted, and a liquid crystal panel located on the backlight unit. The light emitting device package includes a lens located above the light emitting device of the package body and having a recess indented from an upper surface thereof and a curved upper surface defined around the recess to have at least one radius of curvature, the shortest distance from the light emitting device to the lowest portion of the recess being preferably greater than D1/7 and smaller than D1/2.4 wherein D1 is a diameter of the lens. Further, the radius of curvature of the curved upper surface of the lens is preferably greater than 0.8 mm and smaller than 1.8 mm.

According to an embodiment, the present invention provides a light emitting device package comprising: a package body; at least one light emitting device disposed in the package body; at least one pair of leads electrically connected with the light emitting device; and a lens over the light emitting device and having at least one recess at an upper portion of the lens, the shortest distance from the light emitting device to a lowest portion of the recess being greater than approximately D1/7 and smaller than approximately D1/2.4, wherein D1 is a diameter of the lens.

According to an embodiment, the present invention provides a light emitting device package comprising: a package body; at least one light emitting device disposed in the package body; at least one pair of leads electrically connected with the light emitting device; and a lens over the light emitting device and having at least one recess and a curved upper surface defined around the recess to have at least one radius of curvature, the radius of curvature of the curved upper surface of the lens being greater than approximately 0.8 mm and smaller than approximately 1.8 mm.

According to an embodiment, the present invention provides a light emitting device package comprising: a package body; at least one light emitting device disposed in the package body; at least one pair of leads electrically connected with the light emitting device; and a lens over the light emitting device and having at least one recess at an upper portion of the lens and a curved upper surface defined around the recess to have at least one radius of curvature, wherein the shortest distance from the light emitting device to a lowest portion of the recess is greater than approximately D1/7 and smaller than approximately D1/2.4, where D1 is a diameter of the lens, wherein the radius of curvature of the curved upper surface of the lens is greater than approximately 0.8 mm and smaller than approximately 1.8 mm, and wherein a recess angle defined by the recess located at the upper portion of the lens is greater than approximately 90° and smaller than approximately 120°.

According to an embodiment, the present invention provides a backlight unit comprising: at least one light emitting device package including at least one light emitting device disposed in a package body, and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4, wherein D1 is a diameter of the lens; and a circuit board configured to control the at least one light emitting device package.

According to an embodiment, the present invention provides a backlight unit comprising: at least one light emitting device package including at least one light emitting device disposed in a package body, and a lens located above the light emitting device, the lens having at least one recess at an upper portion of the lens and a curved upper surface defined around the recess to have at least one radius of curvature, the radius of curvature of the curved upper surface of the lens being greater than approximately 0.8 mm and smaller than approximately 1.8 mm; and a circuit board configured to control the at least one light emitting device package.

According to an embodiment, the present invention provides a backlight unit comprising: at least one light emitting device package including at least one light emitting device and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4 wherein D1 is a diameter of the lens, the radius of curvature of the curved upper surface of the lens being greater than approximately 0.8 mm and smaller than approximately 1.8 mm, and a recess angle defined by the recess being greater than approximately 90° and smaller than approximately 120°; and a circuit board configured to control the at least one light emitting device package.

According to an embodiment, the present invention provides a liquid crystal display device comprising: a backlight unit including at least one light emitting device package, the at least one light emitting device package including at least one light emitting device and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4 wherein D1 is a diameter of the lens, the radius of curvature of the curved upper surface of the lens being greater than approximately 0.8 mm and smaller than approximately 1.8 mm; and a liquid crystal panel configured to generate images using light supplied by the backlight unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Figure 1:
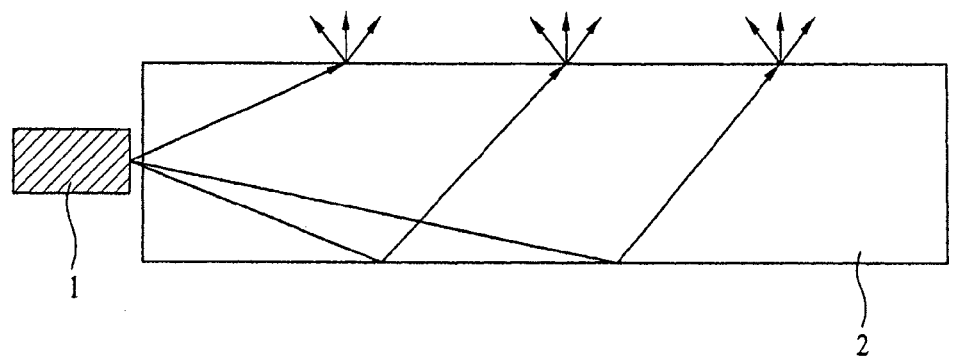
FIG. 1 is a schematic view illustrating an example of a light guide panel type backlight unit according to a related art.
Figure 2:
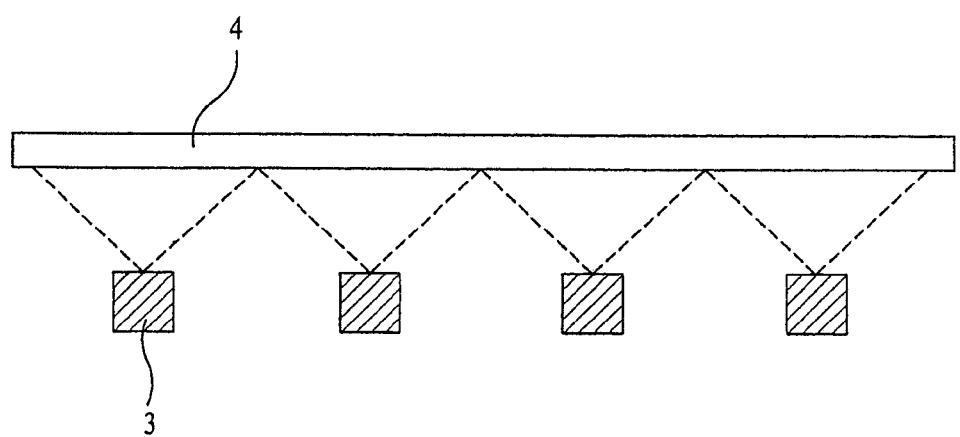
FIG. 2 is a schematic view illustrating an example of a direct type backlight unit according to a related art.

Reference will now be made in detail to the preferred embodiments of the present invention, examples of which are illustrated in the accompanying drawings. Wherever possible, the same reference numbers will be used throughout the drawings to refer to the same or like parts.

The present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that, when an element such as a layer, region or substrate is referred to as being "on" another element, it can be directly on the other element or intervening elements may also be present.

It will be understood that the invention encompasses different orientations of the device in addition to the orientation depicted in the figures. Finally, the term "directly" means that there are no intervening elements. As used herein, the term "and/or" includes any and all combinations of one or more of the associated listed items.

Figure 3:
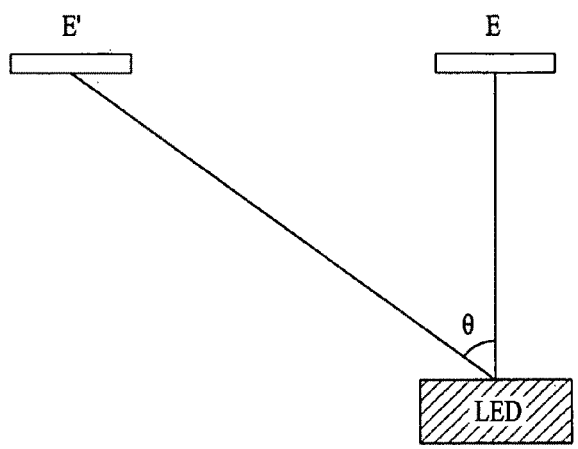
FIG. 3 is a diagram illustrating a viewing pattern of a light emitting device.

In a configuration of a Back Light Unit (BLU) having a fixed or certain thickness, a luminance variation per position is as generally represented by the following Equation 1, in consideration of a positional relationship between an LED (or chip or package) and locations E and E' shown in FIG. 3. In the following Equation 1, E' represents a luminous intensity at an end position, and E represents a luminous intensity at a starting position.

$$E' = E \times \cos^3 \theta \qquad \text{Equation 1}$$

Figure 4:
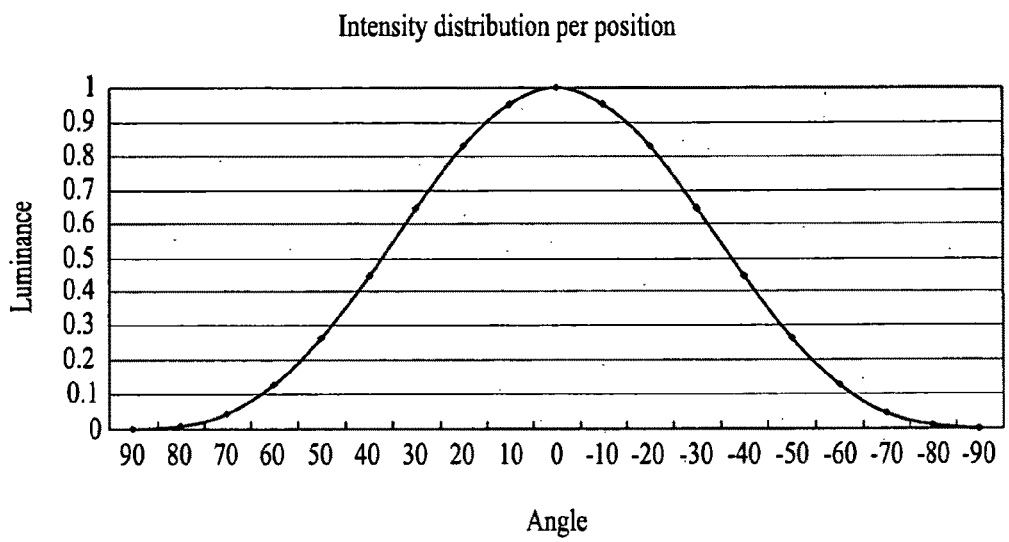
FIG. 4 is a graph illustrating a viewing pattern of a conventional light emitting device.

Generally, as an angle θ of FIG. 3 increases, the luminance intensity decreases as shown in FIG. 4. However, if E' and E are the same, luminance uniformity suitable for a backlight unit can be accomplished. To accomplish the luminance uniformity, then a luminous intensity per position as shown in FIG. 5 is desired.

Figure 5:
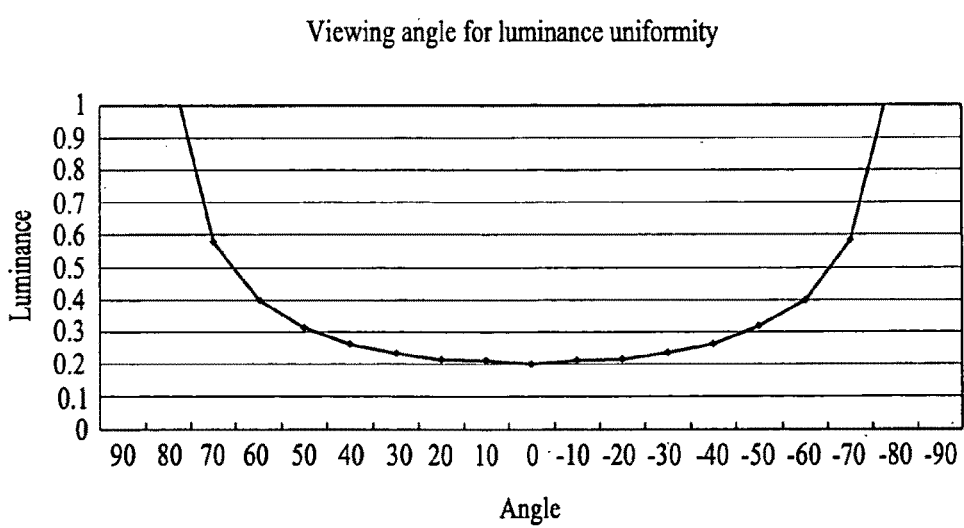
FIG. 5 is a graph illustrating a viewing pattern of a light emitting device for achieving luminance uniformity according to the present invention.

More specifically, as will be appreciated from FIG. 5, to accomplish luminance uniformity, the inventor of the present invention has discovered that the center portion of an LED (or LED chip) (which has an angle θ of 0°) needs to have a low luminous intensity and the luminous intensity needs to increase as the angle θ increases so as to obtain a viewing pattern shown in FIG. 5. A viewing pattern refers to a luminance intensity distribution with respect to a viewing angle θ of an LED (or LED chip). An LED chip may include one or more LEDs therein. Hereinafter, if applicable, the terms such as an LED and an LED chip may be interchangeable used.

This is because a luminous intensity can be represented by the following Equation 2.

$$E' = E \times d \qquad \text{Equation 2}$$

Here, E' represents a luminous intensity at an end position, E represents a luminous intensity at a starting position, and d represents a travel distance of light.

The present invention has a feature in that a lens is formed to have a particular shape and/or configuration with respect to an LED in order to obtain a viewing pattern as shown in FIG.

5 and one or more LEDs formed based on the above results can be arranged at particular intervals or at desired positions in a backlight unit or in other electronic devices, whereby luminance uniformity can be accomplished at a predetermined distance from an upper plane of the LEDs.

To obtain a viewing pattern as shown in FIG. 5, a lens in a light emitting device package according to an embodiment of the present invention satisfies or substantially satisfies one or more of the following three objects.

Firstly, a viewing angle for an LED is maximized according to the present invention.

Figure 6A:
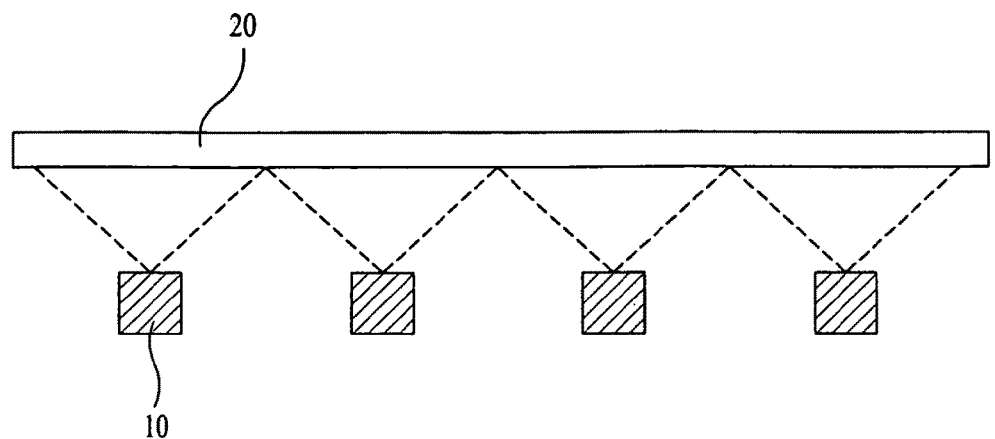
FIGS. 6A and 6B are schematic views illustrating different examples of an arrangement of light emitting devices of a backlight unit based on a viewing angle.

When a backlight unit is constructed using a conventional LED package 10 having a viewing angle of 120° based on Lambertian distribution, the LED package 10 is arranged with respect to a diffuser panel 20 as shown in FIG. 6A, where the viewing angle may not at an optimum level.

Figure 6B:
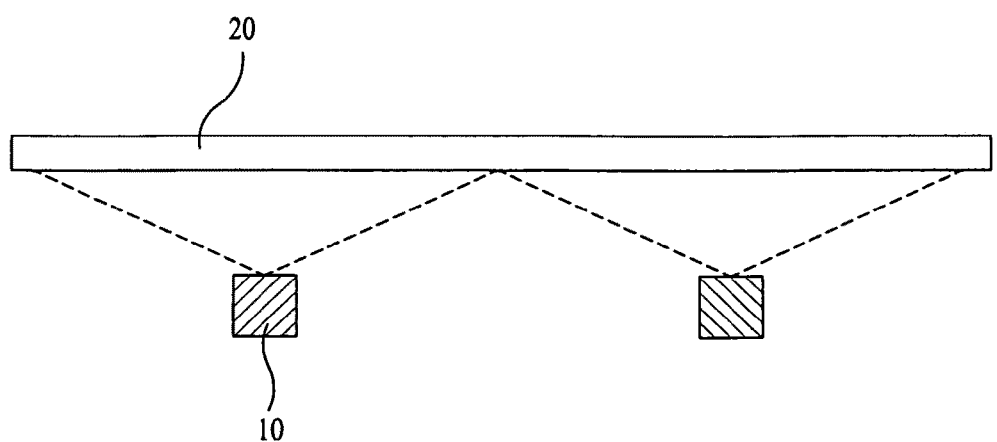

In contrast, according to an embodiment of the present invention, LEDs in a backlight unit are arranged so that a viewing angle of each LED is preferably wider than 120°, which in turn minimizes the number of LEDs used and reduces the thickness of the backlight unit. An example of such a backlight unit including each LED having a viewing angle wider than 120° is shown in FIG. 6B.

Secondly, the luminous intensity distribution at the center of an LED is smaller than the maximum intensity distribution according to the present invention.

When the center illuminating area of the LED has a wide luminous intensity distribution despite the wide viewing angle of the LED, the center illuminating area of the LED exhibits an excessively high luminance. Such a luminance distribution can cause a hot spot, which may result in deterioration in luminance uniformity.

Figure 7A:
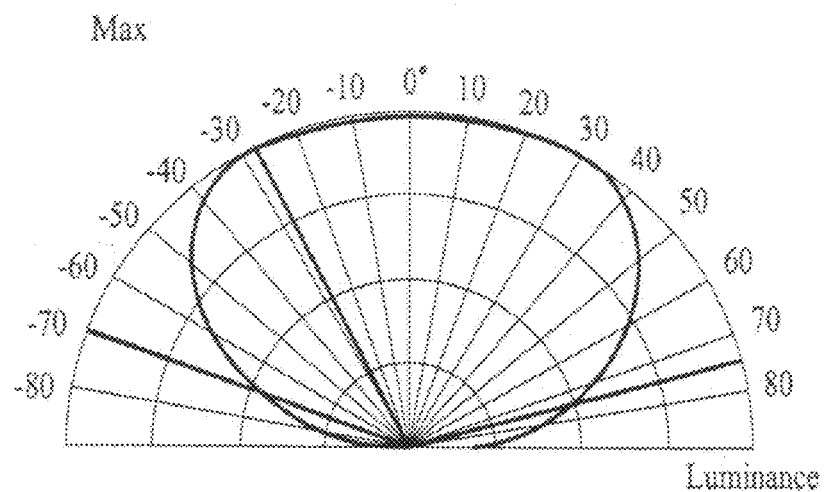
FIGS. 7A and 8A are graphs illustrating different examples of a viewing pattern based on the center luminous intensity.
Figure 7B:
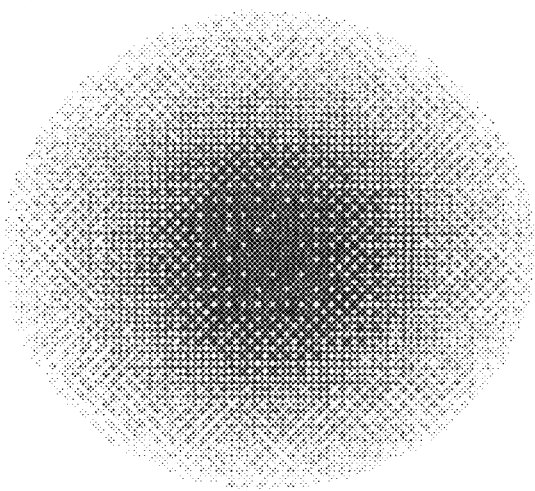
FIGS. 7B and 8B are graphs illustrating different examples of a light pattern based on the center luminous intensity.
Figure 8A:
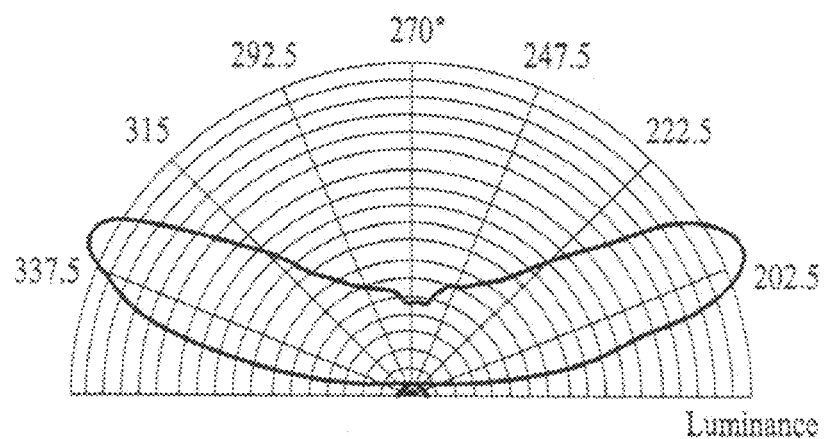
Figure 8B:
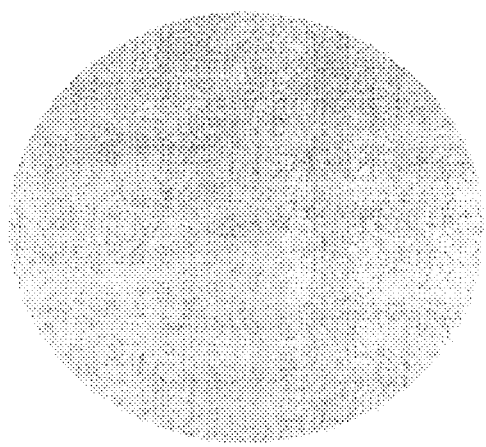

For example, as shown in FIG. 7A, when an LED package (or light emitting device package) has a viewing angle based on a wide luminous intensity distribution at the center thereof, the luminance uniformity may be deteriorated as shown in FIG. 7B (the center black area indicates an area where light is concentrated). Therefore, an LED package (or light emitting device package) according to an embodiment of the present invention is configured to have a viewing angle based on a narrow luminous intensity distribution at the center thereof so that luminance uniformity can be greatly enhanced as shown in FIG. 5B.

Note that numerical values (angles) shown in FIG. 7A indicate viewing angles in polar coordinates and hereinafter, similar numerical values shown on the drawings illustrating viewing patterns indicate viewing angles in polar coordinates.

Thirdly, an entire viewing angle distribution of an LED has a gentle variation according to the present invention.

Even though the viewing angle of an LED is wide and the luminous intensity distribution at the center may be effectively controlled, a ring-shaped dark area may occur when the viewing angle does not have a gentle shape variation.

Figure 9A:
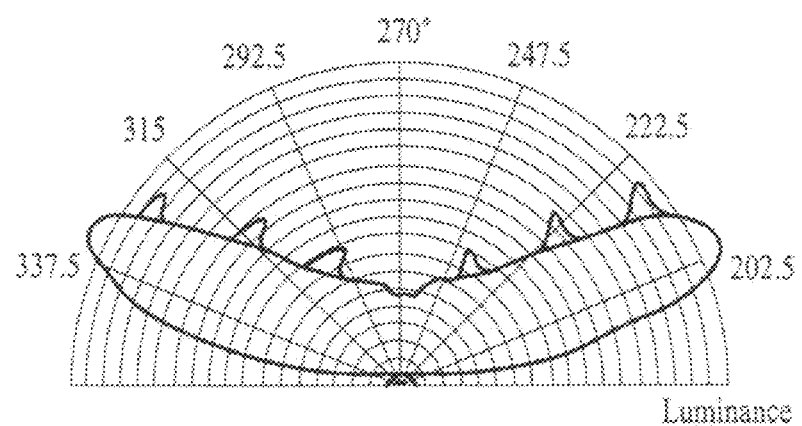
FIGS. 9A to 10B are graphs illustrating different examples of a viewing pattern and a light pattern based on a viewing pattern variation.
Figure 9B:
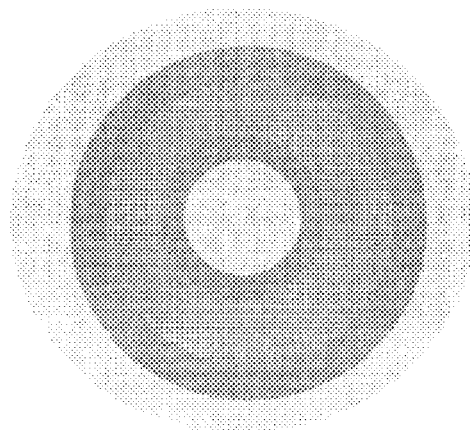
Figure 10A:
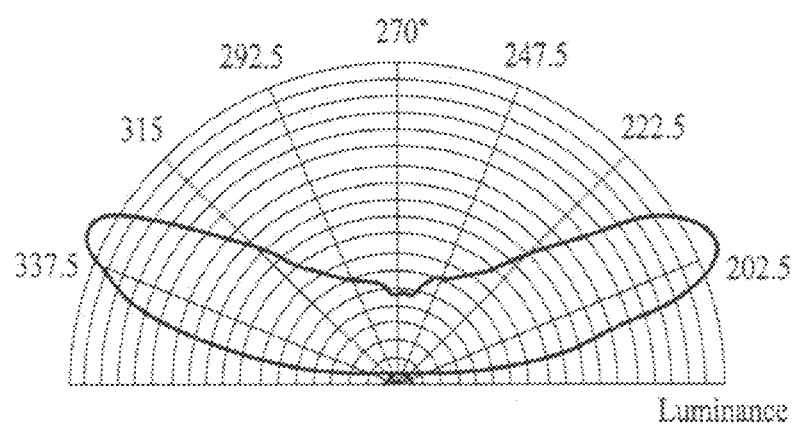
Figure 10B:
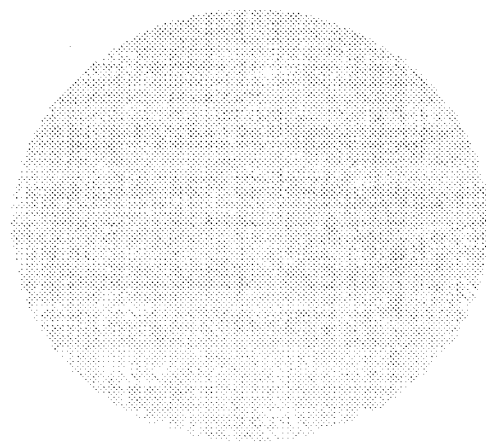

For example, as shown in FIG. 9A, when a viewing pattern of an LED does not have a gentle variation, a ring-shaped pattern can occur as shown in FIG. 9B, which can result in deterioration in luminance uniformity. Thus, according to an embodiment of the present invention, the lens of a light emitting device package has configurations such that the viewing pattern of the LED has a gentle variation as shown in FIG. 10A so that enhanced luminance uniformity can be accomplished as shown in FIG. 10B in the present invention.

Figure 11:
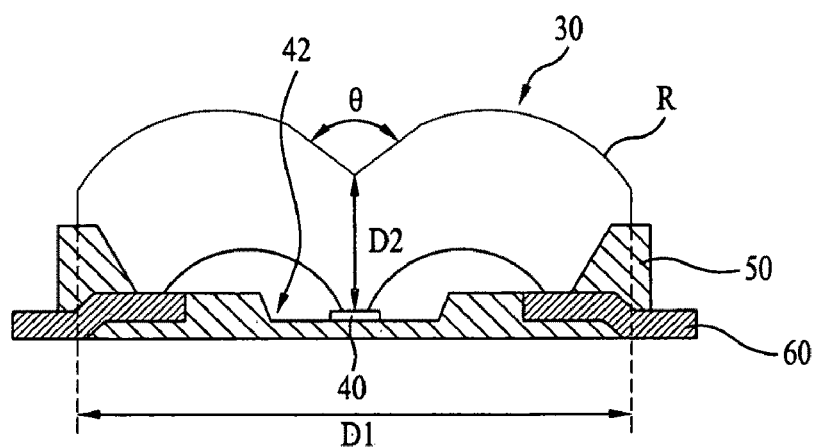
FIG. 11 is a sectional view illustrating an embodiment of a light emitting device package according to the present invention.

Now, configurations of a light emitting device package including one or more lenses for obtaining an optimum viewing pattern as discussed above according to the present invention will be described with reference to FIG. 11. FIG. 11 illustrates a cross sectional view of an example of a light emitting device package according to the present invention.

Referring to FIG. 11, in a light emitting device package according to an embodiment of the present invention, an LED chip 40 is mounted in a groove 42 defined in a light emitting device package body 50 and in turn, a lens 30 is mounted over the LED chip 40. The package body 50 is provided with leads 60 electrically connected with the LED chip 40 through wires. The leads 60 may be disposed at outer or lower positions of the package body 50.

The lens 30 has a recess indented from the center of an upper surface thereof above the LED chip 40 and the upper surface of the lens 30 is curved outward from the recess. The upper surface of the lens 30 extends to a side surface of the lens 30, and a surface of the lens 30 opposite to the upper surface is the lower surface of the lens 30. Preferably, the lens 30 has a circular shape with a recess in the center of the lens 30 as shown in FIG. 31B illustrating a top plan view of the lens, but can be in other shapes.

As a variation, the lens 30 may be directly formed, via injection of a lens material, on the package body 50 on which the LED chip 40 is mounted. In this case, an interface such as an adhesive or other material may not exist between the LED chip 40 and the lens 30. Making the lens 30 come into direct contact with the LED chip 40 can eliminate unnecessary reflection and refraction phenomena and consequently, achieve an improvement in optical performance.

In the present invention, one LED chip 40, or two or more LED chips 40 may be mounted on the package body 50 and correspondingly, the number of the leads 60 may be increased according to the number of the LED chips 40. The two or more LED chips 40 in the package body 50 may have different colors, or may have the same color to enhance a luminous intensity.

The package body 50 is preferably formed with the groove 42 for mounting of the LED chip 40, but such mounting groove may not exist in the package body.

As occasion demands, an encapsulating material 70 (e.g., see FIG. 30) may be filled between the lens 30 and the package body 50. The encapsulating material may be silicone or epoxy resin. If the package body 50 is formed with the mounting groove, the encapsulating material 70 can be preferably filled in the mounting groove according to an embodiment.

The encapsulating material 70 may contain phosphor (or diffuser) as necessary, to change the wavelength of the light emitted from the LED chip 40 into a wavelength band of white or other color. The encapsulating material 70 may also serve as a protective layer for the LED chip 40.

The phosphor (diffuser) may be selected from among a variety of phosphors including yellow, green, red and orange phosphors and the like.

The lens 30 may be attached to the package body 50 by use of a primer or other adhesive secondary material. If the encapsulating material 70 and the lens 30 are made of the same material, the lens 30 can be attached even without using the secondary adhesive.

Alternatively, the lens 30 may be formed via transfer molding or injection molding and be directly attached to the package body 50.

In the present invention, the lens 30 is fabricated in a particular shape and configuration by controlling the following factor(s). This allows one or more of the above-discussed three objects to be obtained, and thus the lens 30 can allow the light emitting device package to achieve the desired optimum viewing pattern. As such, enhanced luminance uniformity can be accomplished and a resulting backlight unit can exhibit improved product quality in the present invention.

The three factors that are controlled and used to determine the shape and configuration of the lens 30 according to the present invention include: a) a distance D2 from the LED chip 40, as a light source, to the lowest portion of the center of the lens 30; b) a radius of curvature R of the lens 30; and c) an angle θ (recess angle) of the center recess of the lens 30.

Now, methods to determine the ranges of these three factors D2, R and θ, which are in turn used to determine the shape and configuration of the lens 30 according to the present invention, will be described in more detail.

<Determination of the Shortest Distance from LED Chip to the Lowest Portion of the Lens Center>

Figure 12A:
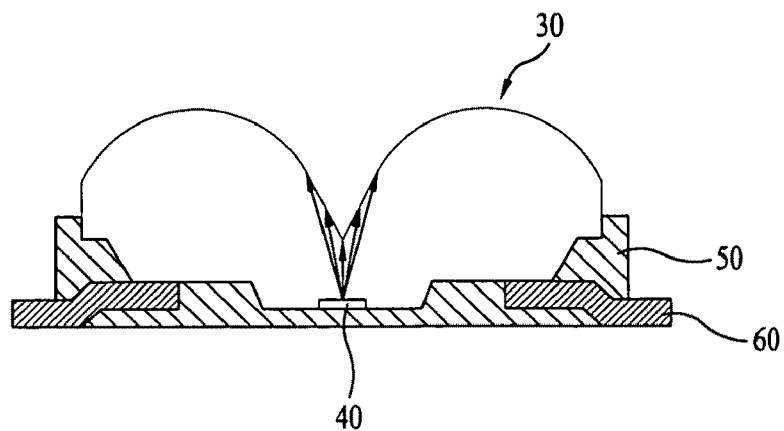
FIGS. 12A to 13C are schematic views for explaining various characteristics of a lens based on variations in a distance D2 from an LED to the lens center.
Figure 12B:
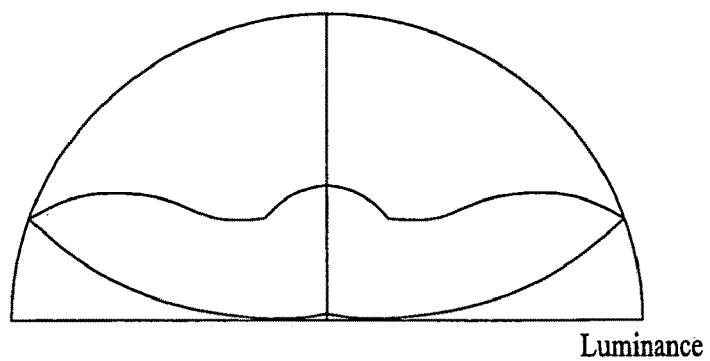
Figure 12C:
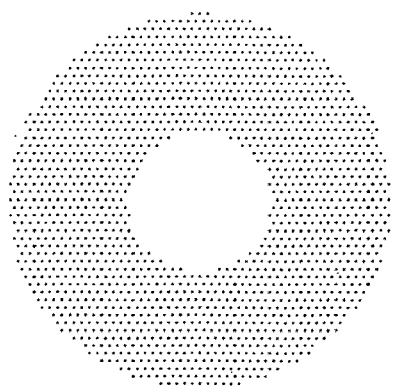

First, if the distance D2 is significantly short, a great amount of light may be emitted through the center recess of the lens as shown in FIG. 12A, and a viewing angle of the LED varies as shown in FIG. 12B. As a result, when a backlight unit is fabricated using this kind of light emitting device package, a hot spot as shown in FIG. 12C can occur at the center of the backlight unit.

Figure 13A:
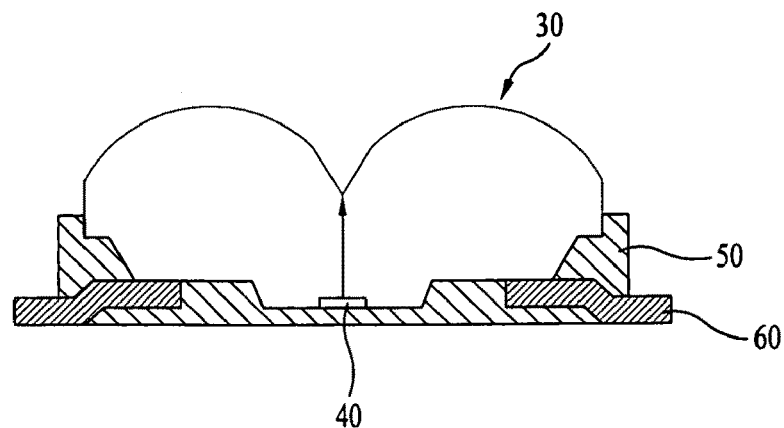
Figure 13B:
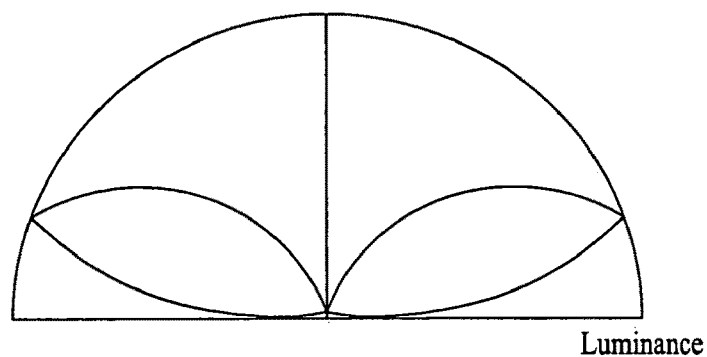
Figure 13C:
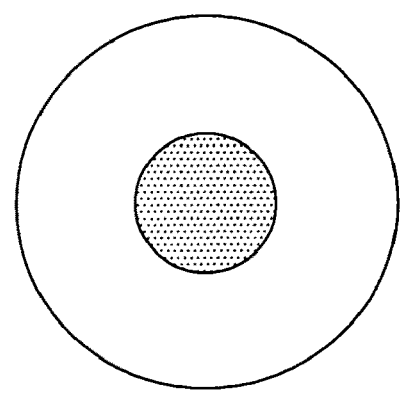

On the other hand, if the distance D2 is significantly long, an extremely small amount of light can be emitted through the center recess of the lens 30 as shown in FIG. 13A and the viewing angle of the LED varies as shown in FIG. 13B. As a result, a resulting backlight unit can exhibit a dark area as shown in FIG. 13C.

As described above, the distance D2 indicates the shortest distance between the LED chip 40 and the center or lowest point of the recess (or corresponding recess) of the lens 30. To provide a backlight unit having a light emitting device package with the most optimum viewing characteristics, the distance D2 needs to be in a predetermined range determined by the inventor of the present invention.

To determine the preferred range for the distance D2, the luminance distribution and viewing pattern of a light emitting device package according to variations in the distance D2 will now be partially described.

Figure 14A:
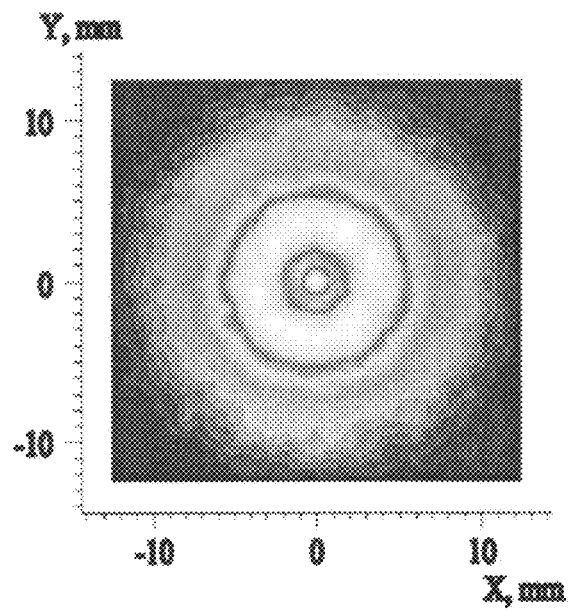
FIGS. 14A and 14B are views illustrating examples of the luminance distribution and viewing pattern of a light emitting device package when D2 is equal to D1/2.5.
Figure 14B:
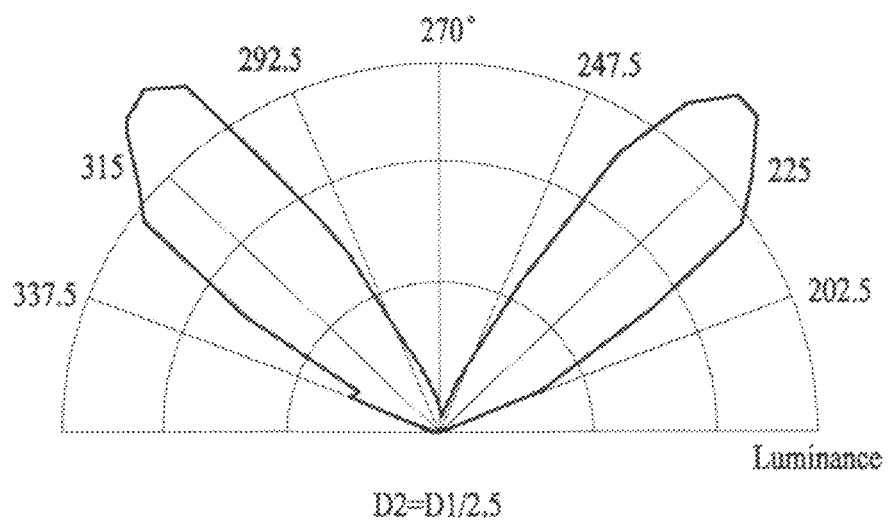
Figure 15A:
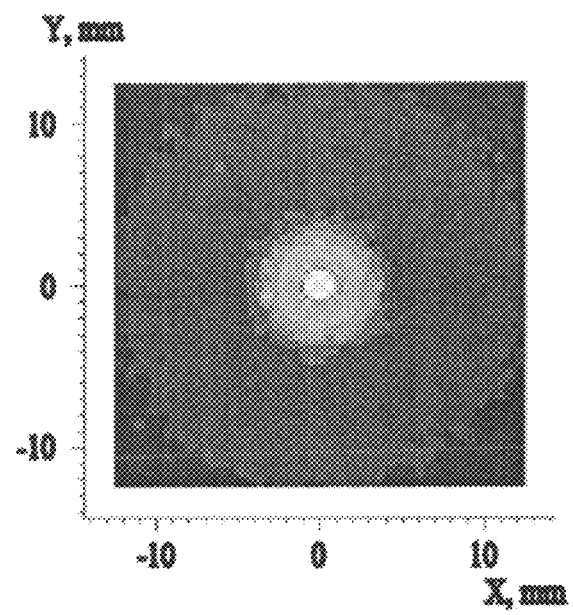
FIGS. 15A and 15B are views illustrating examples of the luminance distribution and viewing pattern of a light emitting device package when D2 is equal to D1/7.1.
Figure 15B:
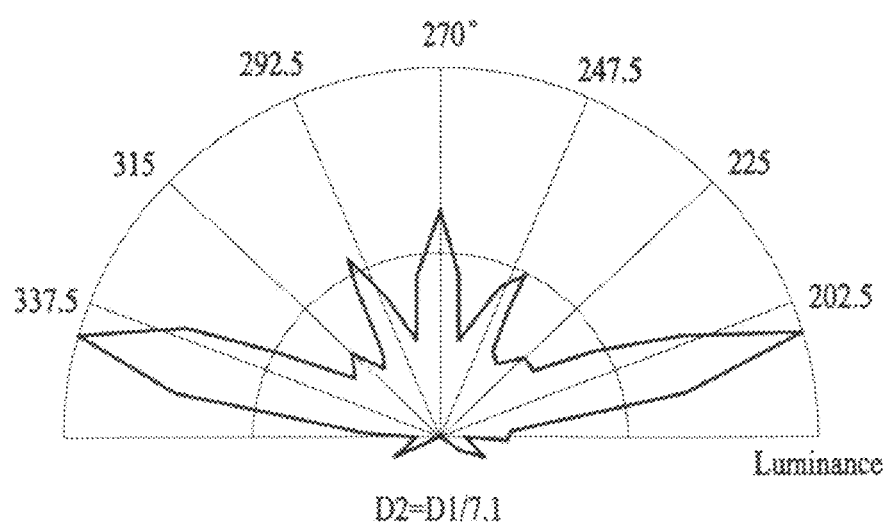

FIGS. 14A and 14B illustrate respectively examples of the luminance distribution and viewing pattern of a light emitting device package (e.g., the light emitting device package of FIG. 11) where the distance D2 of the lens is equal to D1/2.5. Here, D1 represents a diameter of the lens 30. FIGS. 15A and 15B illustrate respectively examples of the luminance distribution and viewing pattern of a light emitting device package (e.g., the light emitting device package of FIG. 11) where the distance D2 of the lens is equal to D1/7.1.

As can be appreciated from these figures, when the distance D2 of the lens has a relatively large value of, e.g., D1/2.5, a bright area can be located in the periphery and a darker area can occur at the center as shown in FIGS. 14A and 14B.

Also, it can be appreciated that, when the distance D2 of the lens has a relatively small value of D1/7.1, a great amount of light is emitted through the center recess, causing the luminance distribution to be concentrated at the center as shown in FIG. 15B and consequently, causing a hot spot as shown in FIG. 15A.

Figure 16A:
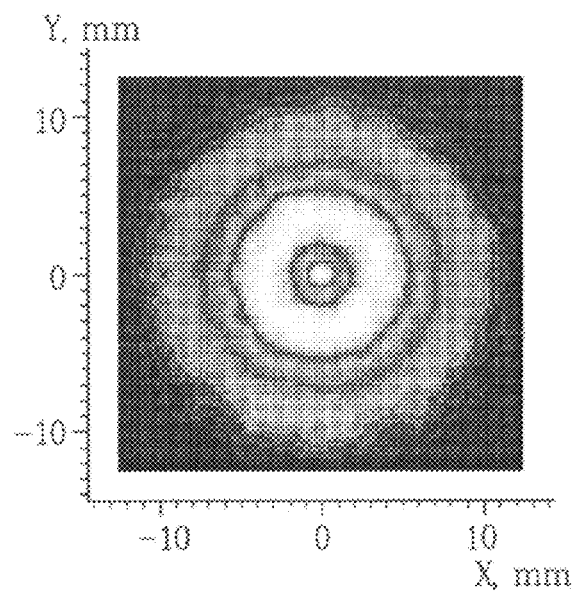
FIGS. 16A and 16B are views illustrating examples of the luminance distribution and viewing pattern of a light emitting device package when D2 is equal to D1/3.
Figure 16B:
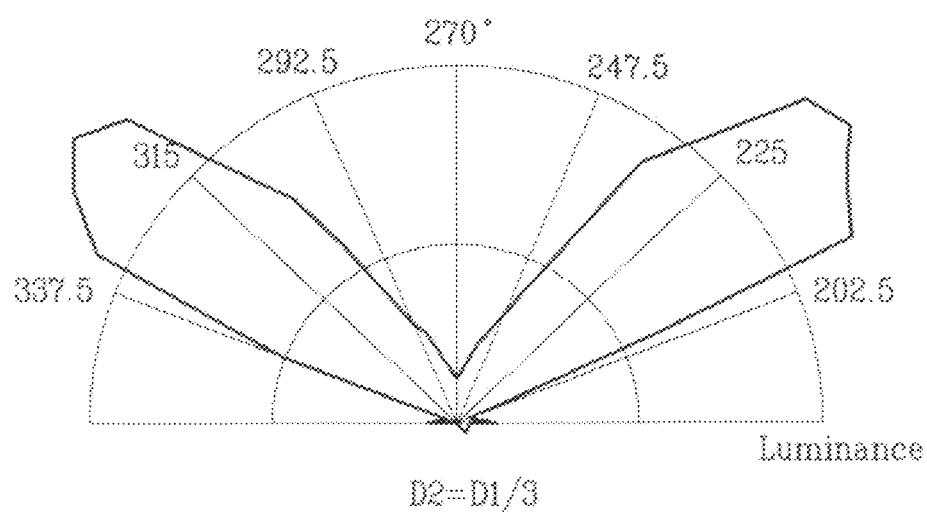
Figure 17A:
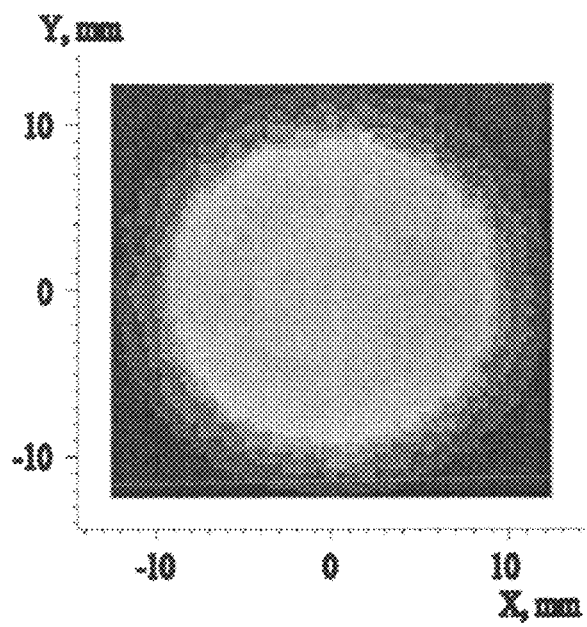
FIGS. 17A and 17B are views illustrating examples of the luminance distribution and viewing pattern of a light emitting device package when D2 is equal to D1/3.85.
Figure 17B:
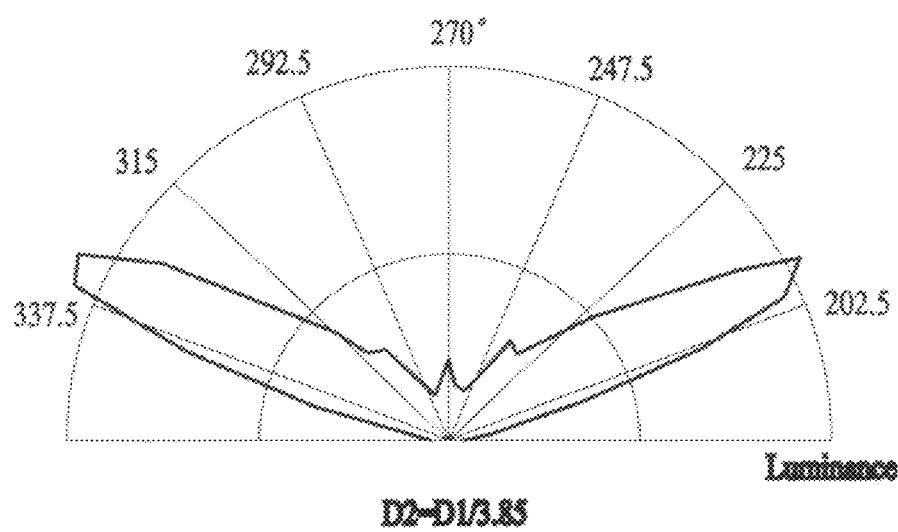

FIGS. 16A and 16B illustrate respectively examples of the luminance distribution and viewing pattern of a light emitting device package (e.g., the light emitting device package of FIG. 11) where the distance D2 of the lens is equal to D1/3, and FIGS. 17A and 17B illustrate respectively examples of the luminance distribution and viewing pattern of a light emitting device package (e.g., the light emitting device package of FIG. 11) when the distance D2 of the lens is preferably equal to D1/3.85.

When the distance D2 is equal to D1/3, although the results do not greatly differ from those of the above-described case where the distance D2 is equal to D1/2.5, it can be appreciated that the center luminance slightly increases as the viewing angle of the LED chip increases as shown in FIGS. 16A and 16B.

Variations in the maximum luminance intensity angle and center luminance intensity according to variations in the distance D2 of the lens are summarized in the following Table 1 as an example.

TABLE 1

| x (for D2 = D1/x) | Max Intensity Angle | Center Intensity |
|---|---|---|
| 2.5 | 43 | 6% |
| 3 | 48 | 12% |
| 4 | 65 | 20% |
| 5 | 68 | 32% |
| 6 | 72 | 45% |
| 7 | 75 | 60% |

In Table 1, the first column represents a value of x which is used in the distance D2 equation of D2=D1/x, the second column represents an angle (e.g., from a center angle) at which the luminance intensity of the LED is at a maximum, and the third column represents the luminance intensity (e.g., in percentage relating to the overall luminance intensity) of the LED at its center angle (e.g., 270 degrees in FIG. 14B). The greater the maximum luminance intensity angle, the greater an area exhibiting luminance uniformity. It is preferred that the center luminance intensity is in a range of 15% to 45% in order to prevent a hot spot or dark area, but can be outside this range (e.g., 6% to 60%).

As described in Table 1, if the distance D2 of the lens is equal to D1/2.5, it can cause a somewhat small maximum luminous intensity angle, and if the distance D2 is equal to D1/7, it can cause a high center luminance intensity.

On the basis of the above results, assuming that the diameter of the lens 30 is D1 and the distance from the LED chip 40 to the center recess of the lens 30 is D2, the most optimum backlight unit consistent with design intentions of the present invention can be made when D2 is in a range as represented by the following Equation 3.

$$D1/7 < D2 < D1/2.4 \qquad \text{Equation 3}$$

Having inspected the luminance distribution and viewing pattern of the package while varying the distance D2 of the lens, it can be further appreciated that more enhanced luminance uniformity can be accomplished as shown in FIG. 17A when the distance D2 is equal to D1/3.85 or approximately D1/3.85.

However, in consideration of the presence of various constituent films of a backlight unit located on a light emitting device package, an LCD panel and the like, the above-described range of the distance D2 in Equation 3 can provide a resulting backlight unit with preferable results according to the present invention.

<Determination of Radius of Curvature>

A radius of curvature of a curved surface in the vicinity of the recess of the lens 30 is a factor to regulate the maximum luminous intensity angle of a viewing angle of the lens/LED.

Figure 18A:
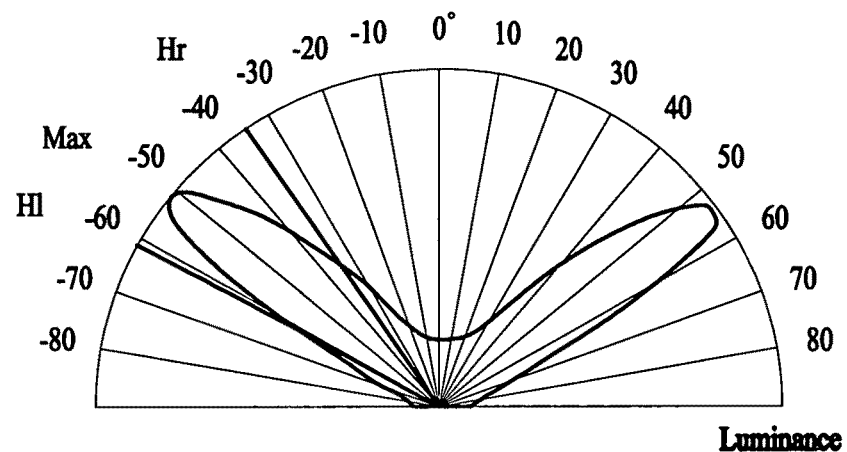
FIGS. 18A and 18B are graphs illustrating examples of a viewing angle based on a radius of curvature R.
Figure 18B:
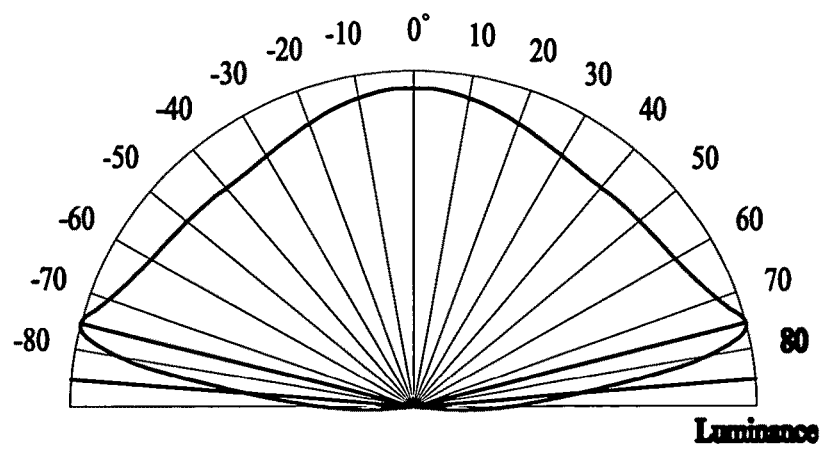

Generally if a radius of curvature of the lens is excessively large, the maximum luminance intensity angle of the viewing angle becomes narrow as shown in FIG. 18A. On the other hand, if a radius of curvature is excessively small, as shown in FIG. 18B, the maximum luminance intensity angle of the viewing angle becomes wide, but this simultaneously entails a reduction in the distance D2 and may cause a hot spot at the center of the illuminated area.

To determine a desired range for a radius of curvature for the lens, the luminance distribution and viewing pattern of the light emitting device package according to a variation in the distance D2 will now be partially described.

Figure 19A:
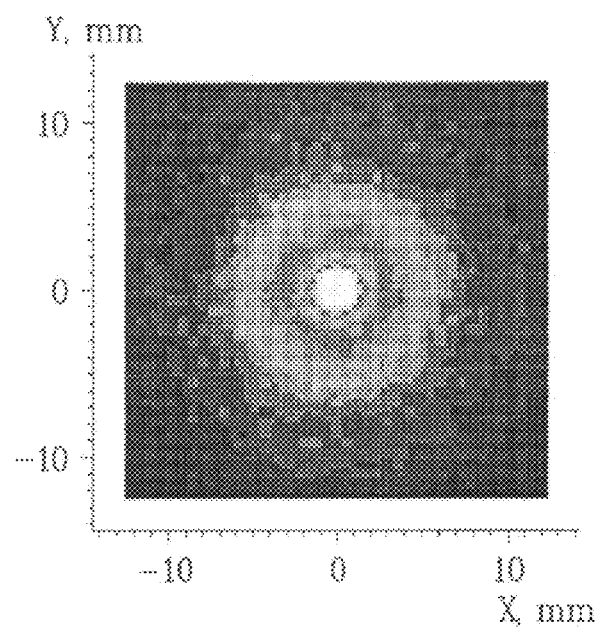
FIGS. 19A and 19B are views illustrating examples of the luminance distribution and viewing pattern of a light emitting device package when R is 1.8 mm.
Figure 19B:
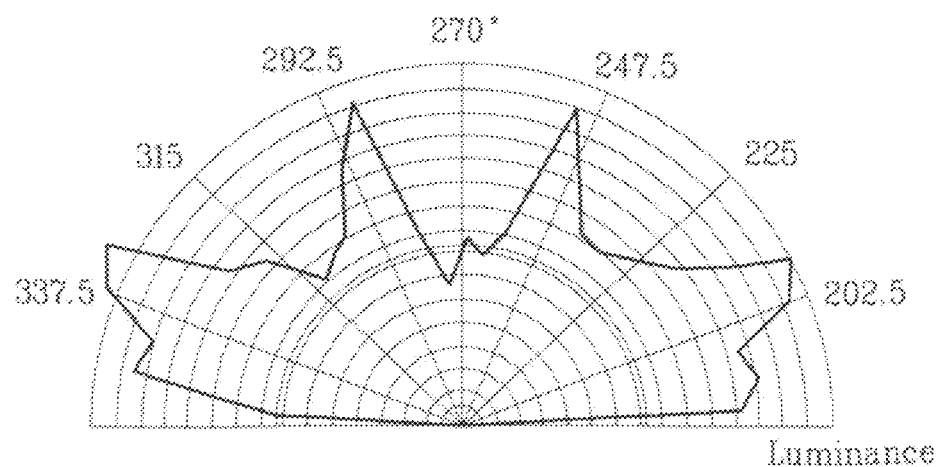
Figure 20A:
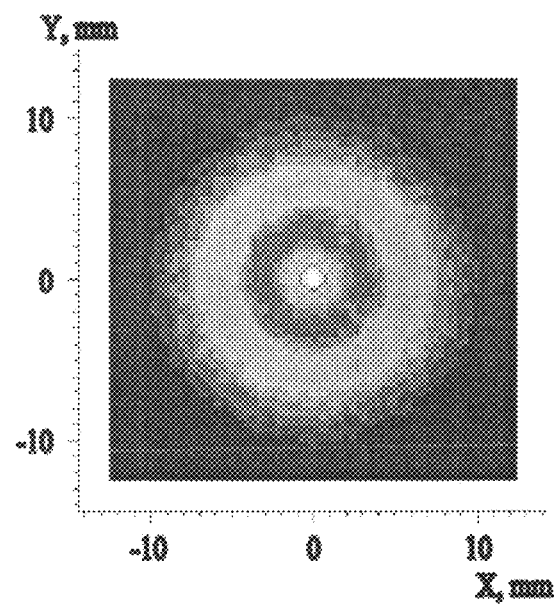
FIGS. 20A and 20B are views illustrating examples of the luminance distribution and viewing pattern of a light emitting device package when R is 0.8 mm.
Figure 20B:
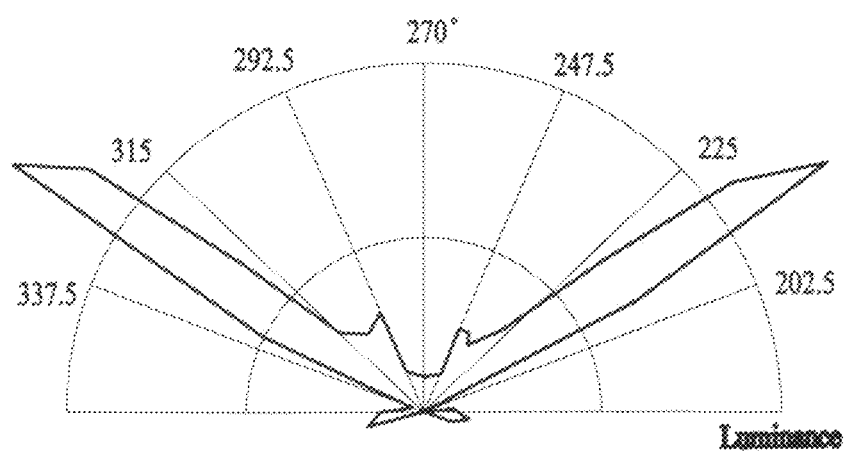

FIGS. 19A and 19B are views illustrating respectively examples of the luminance distribution and viewing pattern of a light emitting device package (e.g., the light emitting device package of FIG. 11) where a radius of curvature R of the lens is 1.8 mm. FIGS. 20A and 20B are views illustrating respectively examples of the luminance distribution and viewing pattern of a light emitting device package where a radius of curvature R of the lens is 0.8 mm.

As can be appreciated from the above description, when the radius of curvature R of the lens of the light emitting device package has a relatively large value of 1.8 mm, the maximum luminance intensity angle of a viewing angle can be reduced to a range of about 250° to 290° as shown in FIG. 19B.

On the other hand, when the radius of curvature R has a relatively small value of 0.8 mm, as shown in FIG. 20B, the maximum luminance intensity angle of the viewing angle is increased to a range of about 337° to 202°, but this simultaneously entails a reduction in the distance D2 and may cause a hot spot at the center.

Figure 21A:
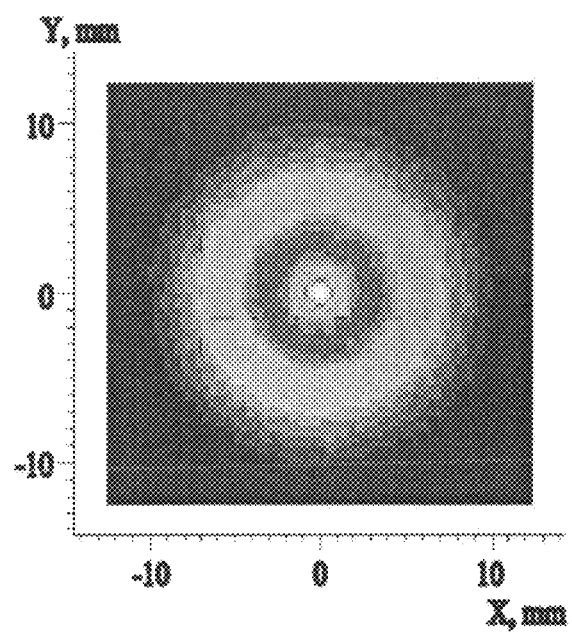
FIGS. 21A and 21B are views illustrating examples of the luminance distribution and viewing pattern of a light emitting device package when R is 1.0 mm.
Figure 21B:
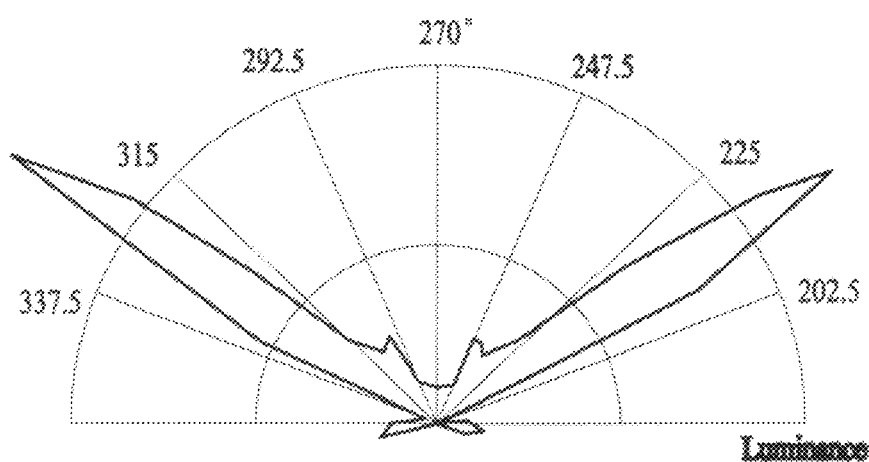
Figure 22A:
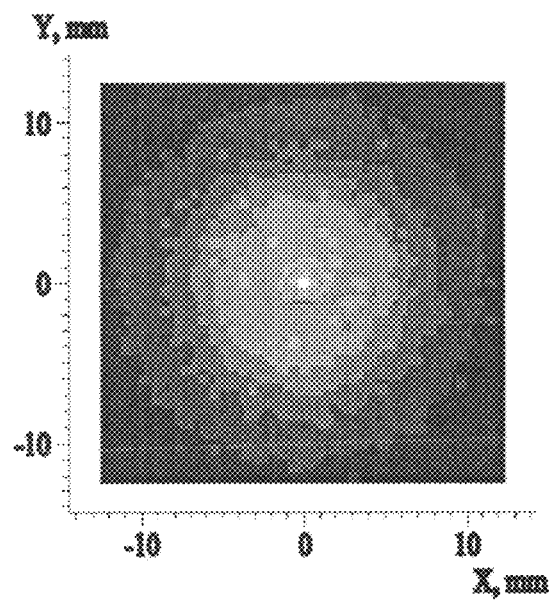
FIGS. 22A and 22B are views illustrating examples of the luminance distribution and viewing pattern of a light emitting device package when R is 1.6 mm.
Figure 22B:
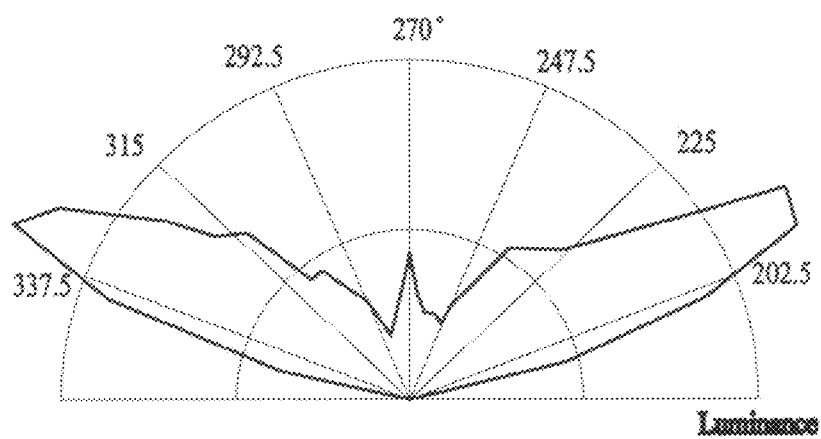

FIGS. 21A and 21B are views illustrating respectively examples of the luminance distribution and viewing pattern of a light emitting device package (e.g., the light emitting device package of FIG. 11) where the radius of curvature R is 1.0 mm, and FIGS. 22A and 22B are views illustrating respectively examples of the luminance distribution and viewing pattern of a light emitting device package (e.g., the light emitting device package of FIG. 11) where the radius of curvature R is 1.6 mm.

Variations in the maximum luminance intensity angle and center luminance intensity according to variations in a radius of curvature R are summarized in the following Table 2 as an example.

TABLE 2

| R | Max Intensity Angle | Center Intensity |
|---|---|---|
| 0.8 | 60 | 12% |
| 1.0 | 61 | 12% |
| 1.2 | 63 | 15% |
| 1.4 | 65 | 20% |
| 1.6 | 67 | 38% |
| 1.8 | 68 | 85% |

As described in Table 2, the radius of curvature R of less than 0.8 mm causes a narrow/small viewing angle, and the radius of curvature R of more than 1.8 mm may cause a hot spot at the center.

Note that Table 2 represents numerical values based on a uniform lens diameter because a radius of curvature is associated with the lens diameter, and the numerical values may be changed when the lens diameter is changed.

Accordingly, it is preferred that the radius of curvature R of the lens satisfies the following Equation 4 to obtain optimum performance.

$$0.8 \text{ mm} < R < 1.8 \text{ mm} \quad \text{Equation 4}$$

As a variation, the radius of curvature R can be in the range of greater than or equal to 0.8 mm and less than or equal to 1.8 mm. Having inspected the luminance distribution and viewing pattern while varying the radius of curvature R, it can be appreciated that more enhanced luminance uniformity can be accomplished as shown in FIG. 22A when the radius of curvature R is 1.6 mm.

A radius of curvature of the lens 30 may be changed on a per position basis, and such a lens is called an aspheric lens. Even in the case of the aspheric lens, note that the entire radius of curvature is preferably in the range set in Equation 4 regardless of an aspheric coefficient according to an embodiment of the present invention. The lens 30 may have one or more radii of curvature.

<Determination of the Angle of the Lens Center Recess>

The angle of the center recess of the lens 30 (also referred to herein as a recess angle) is designated by θ, e.g., see FIG. 11. The recess may be shaped by straight lines, or may be shaped by a predetermined radius of curvature.

The center recess of the lens 30 serves to refract, transmit, or reflect light uniformly and thus, refractivity, transmissivity and reflectivity of light can be controlled according to the angle of the recess.

Figure 23A:
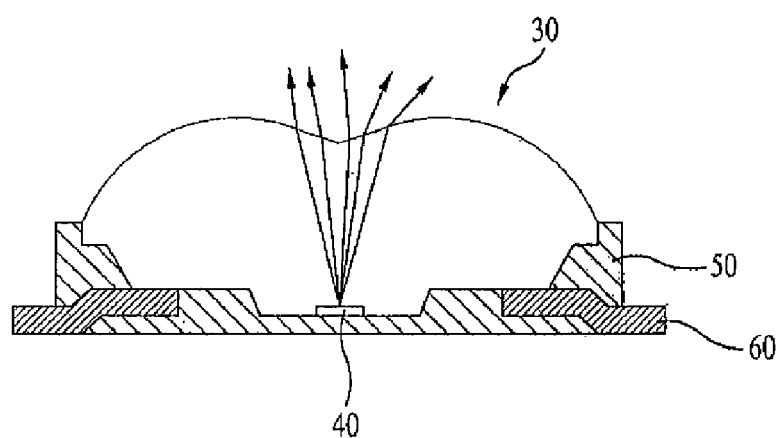
FIGS. 23A and 23B are schematic views illustrating examples of light distribution based on a center recess angle θ.
Figure 23B:
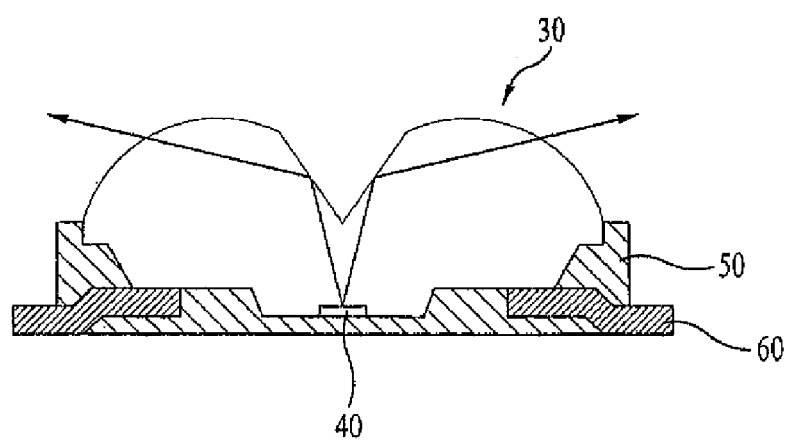

As shown in FIG. 23A, when the center recess of the lens has a wide angle, light may be concentrated at the center rather than being uniformly diffused. On the other hand, when the center recess of the lens has a narrow angle as shown in FIG. 23B, light is mostly diffused to the periphery and may cause a dark area at the center.

Figure 24A:
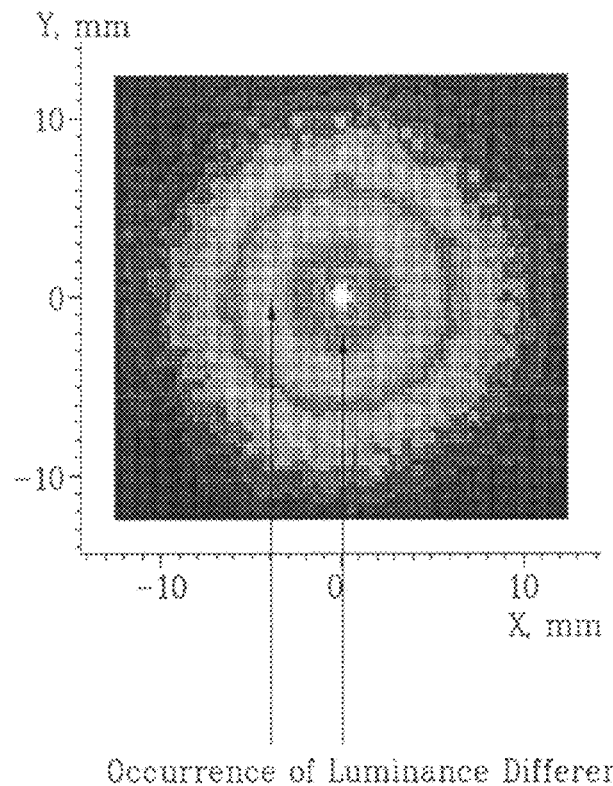
FIGS. 24A and 24B are views illustrating examples of the luminance distribution and viewing pattern of a light emitting device package when θ is 90°.
Figure 24B:
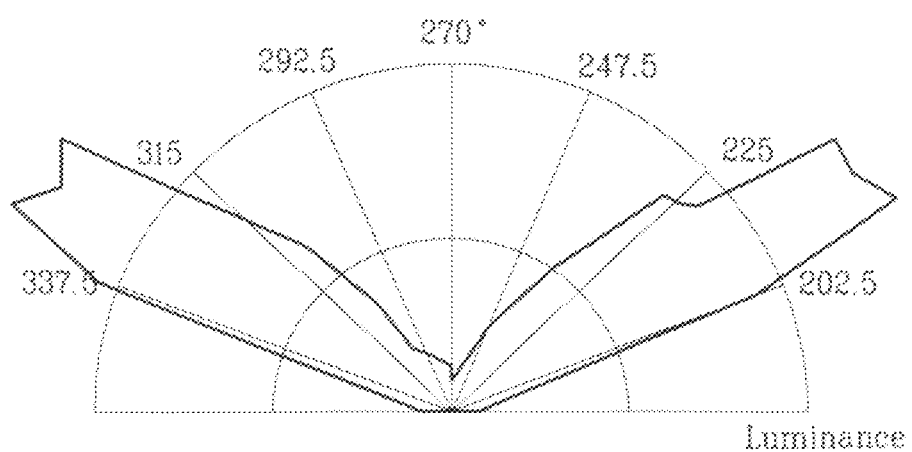

FIGS. 24A and 24B are views illustrating respectively examples of the luminance distribution and viewing pattern of a light emitting device package (e.g., the light emitting device of FIG. 11) where the angle θ is 90°.

Figure 25A:
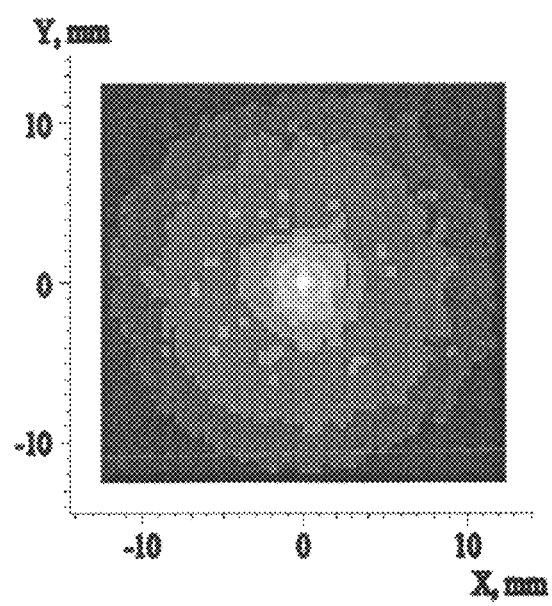
FIGS. 25A and 25B are views illustrating examples of the luminance distribution and viewing pattern of a light emitting device package when θ is 120°.
Figure 25B:
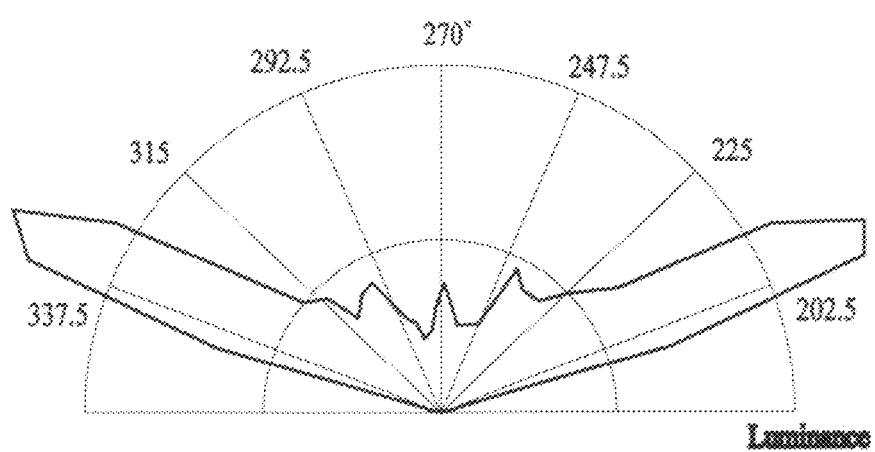

Also, FIGS. 25A and 25B are views illustrating respectively examples of the luminance distribution and viewing pattern of a light emitting device package (e.g., the light emitting device of FIG. 11) where the angle θ is 120°.

As can be appreciated from the above description, when the angle θ has a relatively small value of 90°, light can be diffused to the periphery as shown in FIG. 24A, and a band-shaped pattern can occur at the center due to a difference in luminance.

When the angle θ has a relatively large value of 120°, as shown in FIG. 25B, light is concentrated at the center, preventing a viewing pattern from varying gently and consequently, causing a hot spot at the center as shown in FIG. 25A.

Figure 26A:
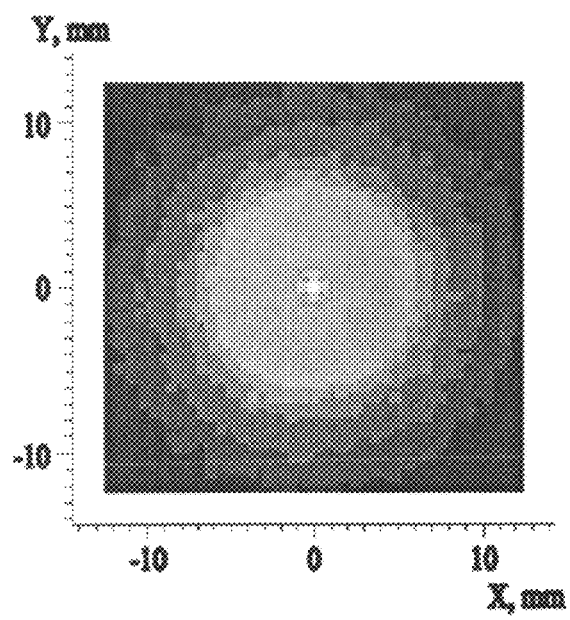
FIGS. 26A and 26B are views illustrating examples of the luminance distribution and viewing pattern of a light emitting device package when θ is 100°.
Figure 26B:
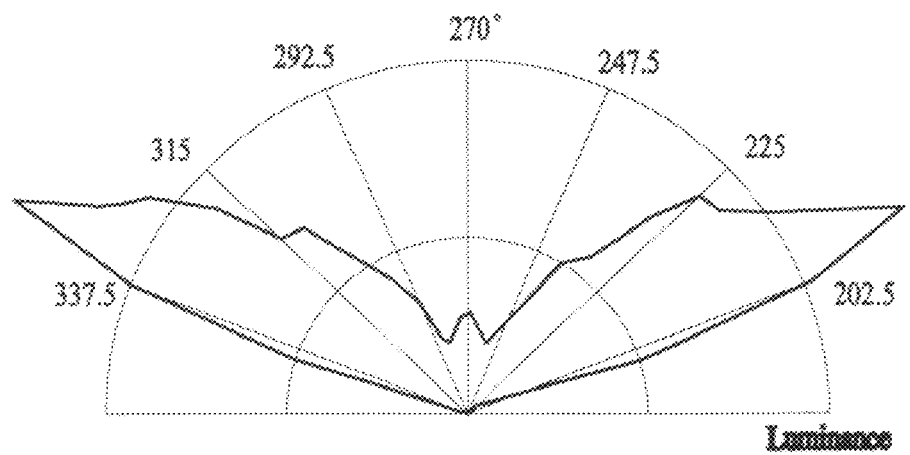
Figure 27A:
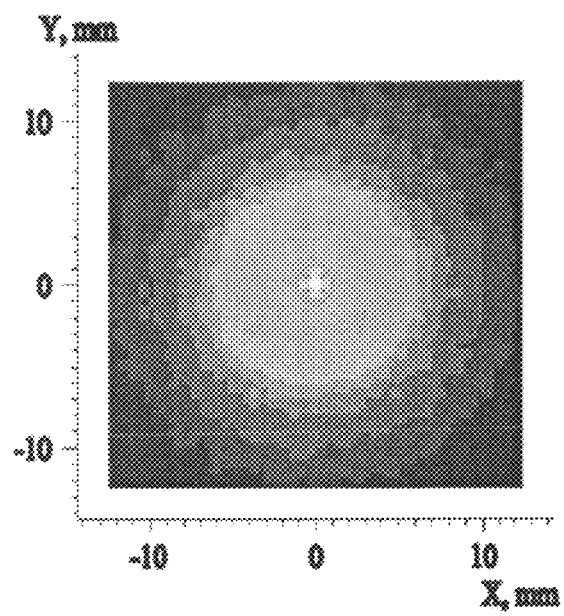
FIGS. 27A and 27B are views illustrating examples of the luminance distribution and viewing pattern of a light emitting device package when θ is 110°.
Figure 27B:
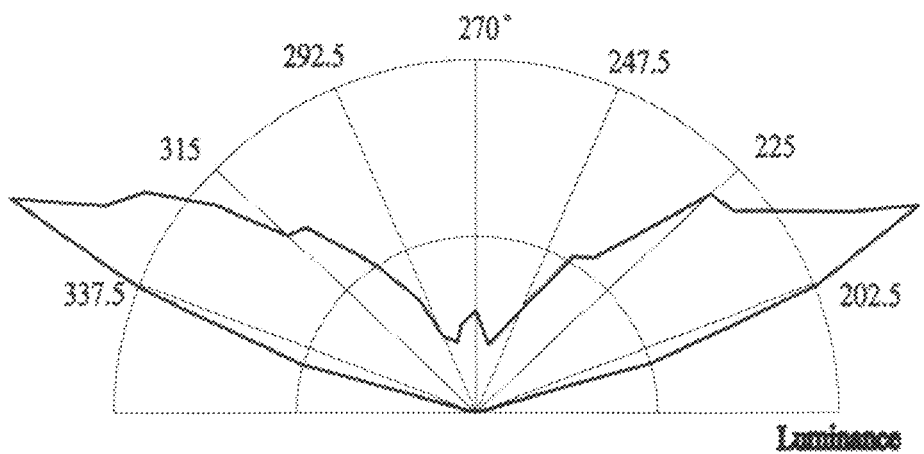

FIGS. 26A and 26B are views illustrating respectively examples of the luminance distribution and viewing pattern of a light emitting device package (e.g., the light emitting device of FIG. 11) where the angle θ is 100°, and FIGS. 27A and 27B are views illustrating respectively examples of the luminance distribution and viewing pattern of a light emitting device package (e.g., the light emitting device of FIG. 11) where the angle θ is 110°.

It can be appreciated that the angle θ of 100° results in a substantially similar luminance distribution to that of the angle θ of 110° and luminance uniformity is accomplished at the center.

Variations in the maximum luminance intensity angle and center luminance intensity according to variations in the angle of the center recess are summarized in the following Table 3.

TABLE 3

| θ | Max Intensity Angle | Center Intensity |
|---|---|---|
| 90 | 61 | 12% |
| 100 | 67 | 20% |
| 110 | 67 | 20% |
| 120 | 70 | 37% |

Figure 28:
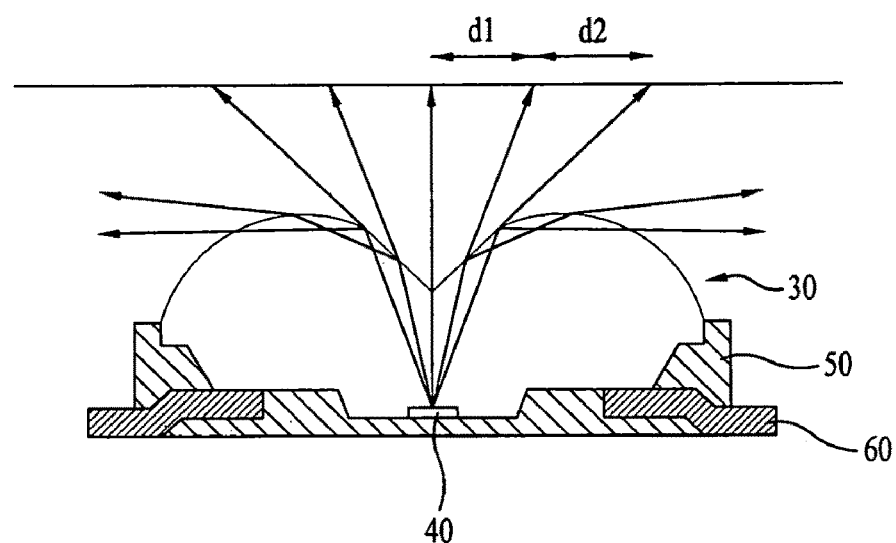
FIG. 28 is a schematic view illustrating an example of the travel directions of light based on an optimum center recess angle.

Referring to FIG. 28, when the center recess of the lens has an optimum recess angle, distances d1 and d2 between luminous fluxes caused when light beams emitted from the LED chip 40 are refracted by an adjacent outer surface of the lens 30 to thereby reach a particular plane may be equal to each other. On the basis of the equal luminous flux distance, luminance uniformity can be accomplished in the vicinity of a viewing angle of 0° to 45°, i.e. above the LED package in a backlight unit or other device.

The angle of the center recess of the lens 30 may be changed according to the size and height of the lens 30. In consideration of the above-described results, the most desirable luminance uniformity can be accomplished when the angle of the center recess is in a range defined by the following Equation 5.

$$90° < \theta < 120°  \quad \text{Equation 5}$$

When the center recess of the lens has a curved profile, more desirable luminance uniformity can be accomplished when an angle defined by tangential lines of the curved profile, designated by straight lines as shown in FIG. 28, is in a range of Equation 5.

According to the present invention, when a light emitting device package includes a lens such as the lens 30 that satisfies at least one of Equation 3 to Equation 5, a backlight unit or any other device using the light emitting device package can achieve sufficient or desirable luminous uniformity.

If the backlight unit, which uses the lens exhibiting the above-described luminous uniformity, is used, it can more than double a distance between the neighboring light emitting device packages, whereby the number of the light emitting device packages present in the backlight unit or other device can be reduced effectively and also, the thickness of the backlight unit can be greatly reduced.

In addition, the backlight unit fabricated according to the present invention causes no boundary between blocks upon LED local dimming. For example, a wide viewing angle of a light emitting device package can eliminate or minimize a problem in that the boundary of blocks is visible during local dimming as one of relevant performance traits of a backlight unit using LEDs. As a result, it is possible to minimize electricity consumption while achieving enhanced contrast with the use of local dimming, and from the viewpoint of screen quality, to provide the most ideal or more desirable LED backlight configuration.

Figure 29:
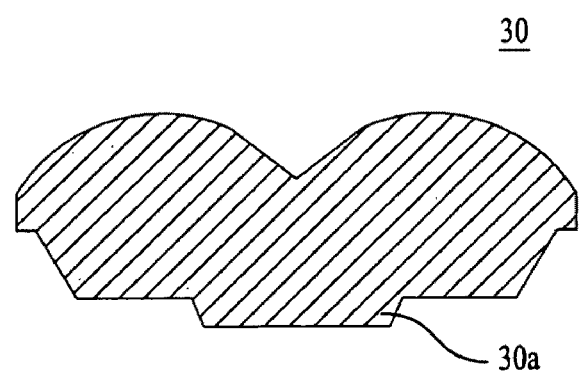
FIG. 29 is a sectional view illustrating an embodiment of a lens according to the present invention.

FIG. 29 illustrates one example of a shape of the lens 30 that fulfills one or more of the above-described factors according to an embodiment of the present invention. If no encapsulating material 70 is located in the mounting groove for the LED chip 40, the lens 30 may be provided at a lower surface thereof with a protrusion 30a to be fitted into the mounting groove. Further, it is also possible that the entire lower surface of the lens 30 is flat without the protrusion 30a.

Figure 30:
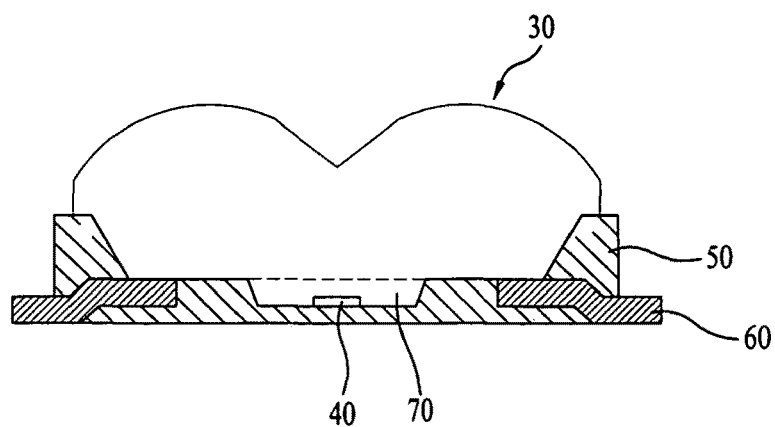
FIG. 30 is a sectional view illustrating a light emitting device package according to an embodiment of the present invention.

As shown in FIG. 30, when the lens 30 is formed on or attached to the LED chip 40, the lens 30 may be shaped as shown in FIG. 29. Here, the lens 30 can be formed directly on the LED chip 40 or can have a material therebetween.

Figure 31A:
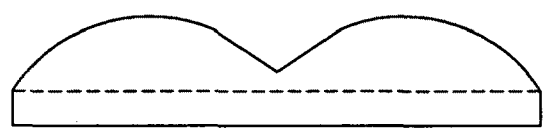
FIG. 31A is a sectional view illustrating a different example of a lens according to the present invention.
Figure 31B:
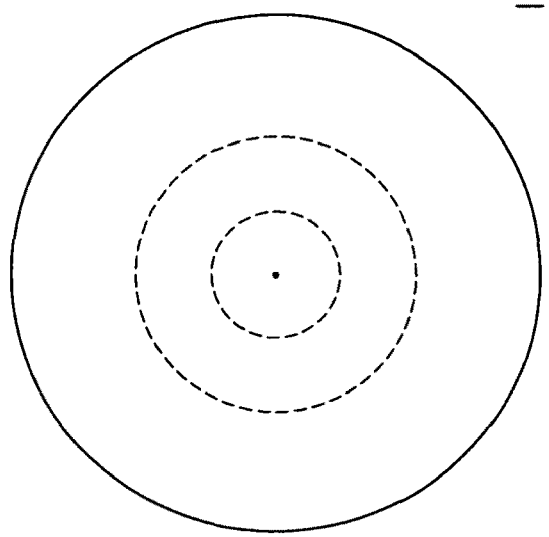
FIG. 31B is a top plan view illustrating an examples of a lens according to the present invention.

If the encapsulating material 70 is provided as a protective layer over the LED chip 40, or if the encapsulating material 70 is provided to fabricate a light emitting device package capable of being changed in color to, for example, a white color and phosphor is mixed into the encapsulating material 70, a lens 31 having a shape as shown in FIG. 31A may be provided. Specifically, the lens 31 may have a planar lower surface without a protrusion to be fitted into the mounting groove.

As shown in FIG. 30B illustrating a top plan view of the lens 31, the lens 31 can have a circular shape, but can have other shapes. Further, this is not limited to the lens 31, but is applicable to other lenses such as the lens 30. That is, any lens of a light emitting device package according to various examples of the present invention can have a circular shape or other suitable shapes.

Figure 32:
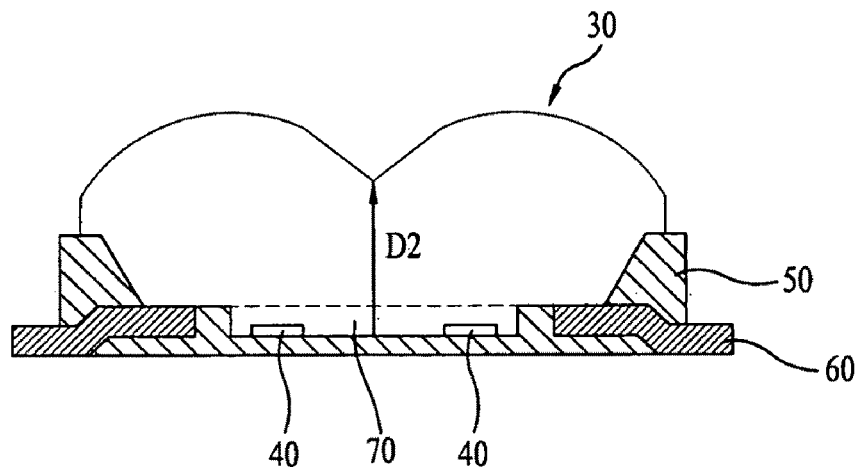
FIG. 32 is a sectional view illustrating another example of a light emitting device package according to the present invention.

FIG. 32 illustrates an embodiment wherein a plurality of LED chips 40 are provided according to the present invention. The plurality of LED chips 40 may emit the same color of light or different colors of light.

In this example, the distance D2 from the center point of the plurality of LED chips 40 to the lowest portion of the center recess and the diameter D1 of the lens 30 satisfies the above-described condition that D2 is greater than D1/7 and smaller than D1/2.4. In that case, as shown, the center point of the LED chips 40 is located on the same plane as a mounting plane of the LED chips 40. In other examples, each of various light emitting devices having various lenses (e.g., lens 30 or 31) and configurations according to the present invention can have a plurality of LED chips 40 therein.

Figure 33:
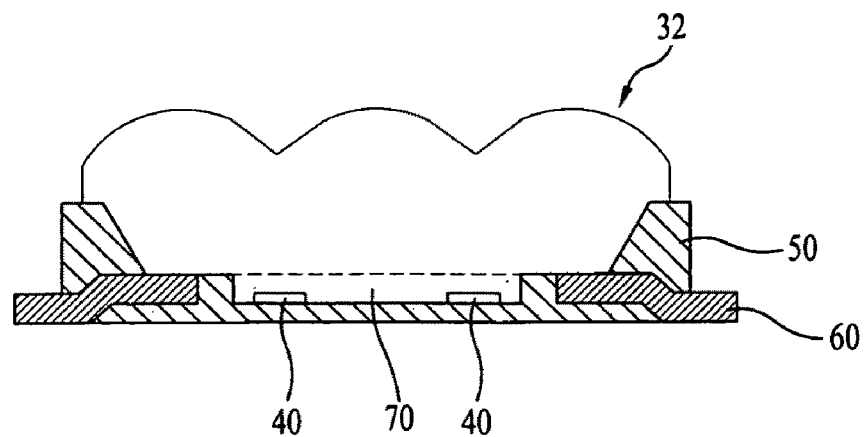
FIG. 33 is a sectional view illustrating another example of a light emitting device package according to the present invention.

FIG. 33 illustrates an embodiment wherein a plurality of LED chips 40 are provided and a lens 32 has a plurality of recesses. For example, two or more recesses may be provided at various locations on the top surface area of the lens. In another example, one or more rings of recesses may be provided at the top surface area of the lens. In the example of FIG. 33, the number of LED chips 40 may be equal to the number of recesses, and the locations of the recesses correspond to the locations of the LED chips 40. Further, the distance D2 from each LED chip 40 to the lowest portion of the corresponding recess satisfies the above-described condition as represented by Equation 3 pertaining to D2.

According to the above descriptions, the present invention provides a light emitting device package including one or more lenses each having one or more recesses, which satisfies or substantially satisfies one or more of Equation 3, Equation 4, and Equation 5. Such a light emitting device package offers various improved performance qualities including uniform luminance, and can be used in a backlight unit for a display device or in other suitable device.

<Liquid Crystal Display Device>

Figure 34:
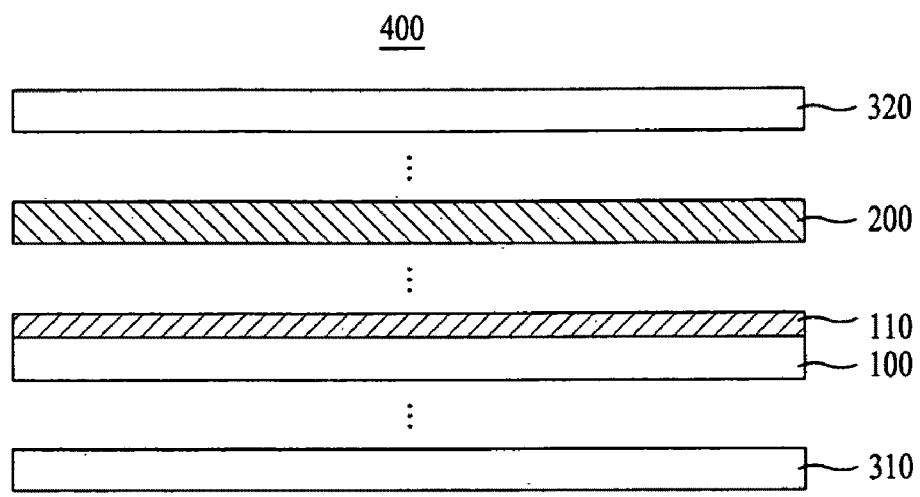
FIG. 34 is an exploded view illustrating an example of a liquid crystal display device according to the present invention.
Figure 35:
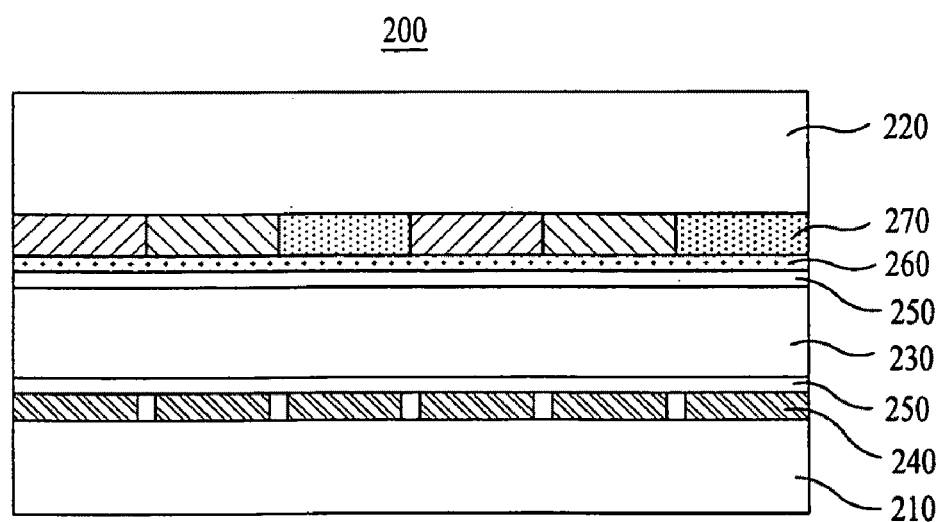
FIG. 35 is a sectional view illustrating an example of a liquid crystal panel according to the present invention.

As shown in FIGS. 34 and 35, a liquid crystal display device 400 can be constructed such that a liquid crystal panel 200 is disposed on a backlight unit 100 using a light emitting device package containing the above-described lens according to the present invention. All components of the liquid crystal display device are operatively coupled and configured.

The backlight unit 100 may be any one of a direct type backlight unit and a light guide panel type backlight unit.

The liquid crystal panel 200, located on the backlight unit 100, can include upper and lower substrates 210 and 220 opposite each other, and a liquid crystal layer 230 filled between the upper and lower substrates 210 and 220.

A drive unit may be provided at a side of the liquid crystal panel 200 for driving of the liquid crystal panel 200.

A lower cover 310 may be provided to cover the backlight unit 100, and an upper cover 320 may be provided at the upper side of the liquid crystal panel 200 to cover the entire surface of the liquid crystal panel 200.

The liquid crystal panel 200 contains liquid crystal cells, as pixel units, arranged in a matrix, and is adapted to form images by regulating light transmissivity of the liquid crystal cells according to image signal information transmitted from the drive unit.

The drive unit may include a Flexible Printed Circuit (FPC) board, drive chips mounted on one side of the FPC board, and a Printed Circuit Board (PCB) connected to the other side of the FPC board.

As shown, the backlight unit 100 is located at a rear side of the liquid crystal panel 200, and a plurality of optical sheets 110 may be provided on the backlight unit 100.

The optical sheets 110 are located on a rear surface of the liquid crystal panel 200 and may include at least one of a diffuser sheet, a prism sheet and a protective sheet.

Here, the diffuser sheet serves to diffuse light from the backlight unit 100 so as to supply the light to the liquid crystal panel 200. The prism sheet is configured such that micro prisms in the form of triangular columns are arranged on an upper surface of the prism sheet with a predetermined interval. The prism sheet serves to concentrate the light diffused by the diffuser sheet into a direction perpendicular to a plane of the liquid crystal panel 200 above the prism sheet. The microprisms formed on the prism sheet can have a desired angular shape. Almost all of the light having passed through the prism sheet travels perpendicular to the prism sheet, providing luminance uniformity. The protective sheet as an uppermost sheet serves to protect the prism sheet from scratches or others.

As shown in FIG. 35, the lower substrate 210 of the liquid crystal panel 200 is provided with a plurality of gate lines and a plurality of data lines in a matrix, and pixel electrodes and Thin Film Transistors (TFTs) 240 at intersections of the gate lines and data lines.

If signal voltages applied through the TFTs 240 are supplied to the liquid crystal layer 230 by the pixel electrodes, the liquid crystal layer 230 is aligned in response to the signal voltages, and light transmissivity is determined.

The upper substrate 220 is provided with a color filter 270 including RGB pixels which represent certain colors upon passage of light, and a common electrode 260 made of a transparent conductive material such as Indium Tin Oxide (ITO) or Indium Zinc Oxide (IZO) or the like. Alignment films 250 may be provided at upper and lower sides of the liquid crystal layer 230.

The above-described liquid crystal display device 400 can achieve maximized performance with the use of the above described backlight unit having one or more light emitting device packages according to the present invention. Further, FIGS. 34 and 35 are provided only as an example of a liquid crystal display device having the backlight unit according to the present invention. Thus, the invention is not limited to the liquid crystal display device of FIGS. 34 and 35, but encompasses other types of display devices including transreflective type liquid crystal display devices, in-plane switching (IPS) type liquid crystal display devices, non-LCD type displays which use a backlight unit, etc.

<Liquid Crystal Display TV>

With the use of the above-described liquid crystal display device such as the device 400, a liquid crystal display TV can be constructed. All components of the liquid crystal display TV are operatively coupled and configured.

Figure 36:
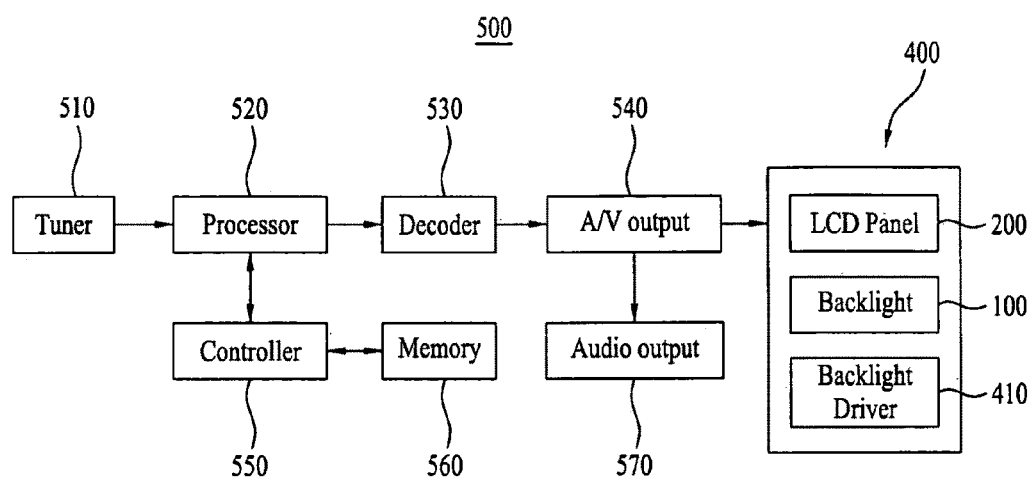
FIG. 36 is a block diagram illustrating an example of a liquid crystal display TV including a liquid crystal display device according to the present invention.

As shown in FIG. 36, the liquid crystal display TV 500 may include a tuner 510 to receive broadcast data streams, and a processor 520, decoder 530 and A/V output unit 540 through which the broadcast data streams are transmitted to the liquid crystal display device 400 so as to be displayed on the liquid crystal display device 400.

The tuner 510 or processor 520 can be controlled in operation via a controller 550, and the controller 550 may be provided with a memory 560. The controller 550 can control all components and operations of the liquid crystal display device.

Thereafter, if a user selects and designates an arbitrary broadcast channel, the controller 550 controls the tuner 510 and processor 520, to tune into the corresponding broadcast channel. The processor 520 separates and outputs audio and video data streams of a broadcast program provided via the broadcast channel.

The decoder 530 decodes the data stream of the broadcast program, output from the processor 520, into audio and video information, to output the audio and video information on output devices, for example, the liquid crystal display device 400, an audio output unit 570 such as a speaker unit, and etc. via the A/V output unit 540.

In this case, a backlight driver 410 drives or controls the backlight unit 100, thereby enabling display of image and other signals on the liquid crystal display panel 200.

The broadcast data streams transmitted to the processor 520 may be provided via the Internet or other network.

Further, FIG. 36 is provided only as an example of a TV having the backlight unit according to the present invention. Thus, the invention is not limited to the device of FIG. 36, but encompasses other types of TVs and other devices including a display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package comprising:
   a package body;
   at least one light emitting device disposed in the package body;
   at least one pair of leads electrically connected with the light emitting device; and
   a lens over the light emitting device and having at least one recess at an upper portion of the lens, the shortest distance from the light emitting device to a lowest portion of the recess being greater than approximately D1/7 and smaller than approximately D1/2.4, wherein D1 is a diameter of the lens.

2. The package according to claim 1, wherein the light emitting device is mounted in a mounting groove formed in the package body.

3. The package according to claim 2, wherein the mounting groove is filled with an encapsulating material.

4. The package according to claim 3, wherein the encapsulating material contains phosphor.

5. The package according to claim 1, wherein the lens has a lower surface opposite to an upper surface and formed with a protrusion to be fitted into a mounting groove formed in the package body.

6. The package according to claim 1, wherein the lens is directly formed on the package body.

7. The package according to claim 1, wherein the at least one light emitting device includes a plurality of light emitting devices, and the recess is located at a center upper portion of the lens.

8. The package according to claim 1, wherein the at least one light emitting device includes a plurality of light emitting devices, and/or the at least one recess includes a plurality of recesses.

9. The package according to claim 8, wherein the plurality of recesses are formed at locations corresponding to the plurality of light emitting devices.

10. The package according to claim 1, wherein the lens further includes a curved upper surface defined around the recess to have a radius of curvature R satisfying a condition of: approximately 0.8 mm<R<approximately 1.8 mm.

11. The package according to claim 1, wherein a recess angle θ defined by the recess located at the upper portion of the lens satisfies a condition of: approximately 90°<θ<approximately 120°.

12. A light emitting device package comprising:
a package body;
at least one light emitting device disposed in the package body;
at least one pair of leads electrically connected with the light emitting device; and
a lens over the light emitting device and having at least one recess and a curved upper surface defined around the recess to have at least one radius of curvature, the radius of curvature of the curved upper surface of the lens being greater than approximately 0.8 mm and smaller than approximately 1.8 mm.

13. The package according to claim 12, wherein a recess angle θ defined by the recess located at an upper portion of the lens satisfies a condition of: approximately 90°<θ<approximately 120°.

14. A light emitting device package comprising:
a package body;
at least one light emitting device disposed in the package body;
at least one pair of leads electrically connected with the light emitting device; and
a lens over the light emitting device and having at least one recess at an upper portion of the lens and a curved upper surface defined around the recess to have at least one radius of curvature,
wherein the shortest distance from the light emitting device to a lowest portion of the recess is greater than approximately D1/7 and smaller than approximately D1/2.4, where D1 is a diameter of the lens,
wherein the radius of curvature of the curved upper surface of the lens is greater than approximately 0.8 mm and smaller than approximately 1.8 mm, and
wherein a recess angle defined by the recess located at the upper portion of the lens is greater than approximately 90° and smaller than approximately 120°.

15. A backlight unit comprising:
at least one light emitting device package including at least one light emitting device disposed in a package body, and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4, wherein D1 is a diameter of the lens; and
a circuit board configured to control the at least one light emitting device package.

16. The backlight unit according to claim 15, wherein the radius of curvature R of the curved upper surface around the recess of the lens satisfies a condition of: approximately 0.8 mm<R<approximately 1.8 mm.

17. The backlight unit according to claim 15, wherein a recess angle θ defined by the recess of the lens satisfies a condition of: approximately 90°<θ<approximately 120°.

18. A backlight unit comprising:
at least one light emitting device package including at least one light emitting device disposed in a package body, and a lens located above the light emitting device, the lens having at least one recess at an upper portion of the lens and a curved upper surface defined around the recess to have at least one radius of curvature, the radius of curvature of the curved upper surface of the lens being greater than approximately 0.8 mm and smaller than approximately 1.8 mm; and
a circuit board configured to control the at least one light emitting device package.

19. The backlight unit according to claim 18, wherein a recess angle θ defined by the recess located at the upper portion of the lens satisfies a condition of: approximately 90°<θ<approximately 120°.

20. A backlight unit comprising:
at least one light emitting device package including at least one light emitting device and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4 wherein D1 is a diameter of the lens, the radius of curvature of the curved upper surface of the lens being greater than approximately 0.8 mm and smaller than approximately 1.8 mm, and a recess angle defined by the recess being greater than approximately 90° and smaller than approximately 120°; and
a circuit board configured to control the at least one light emitting device package.

21. A liquid crystal display device comprising:
a backlight unit including at least one light emitting device package, the at least one light emitting device package including at least one light emitting device and a lens located above the light emitting device, the lens having at least one recess at an upper portion of the lens and a curved upper surface defined around the recess to have at least one radius of curvature, the shortest distance from the light emitting device to a lowest portion of the recess being greater than approximately D1/7 and smaller than approximately D1/2.4 wherein D1 is a diameter of the lens, the radius of curvature of the curved upper surface of the lens being greater than approximately 0.8 mm and smaller than approximately 1.8 mm; and
a liquid crystal panel configured to generate images using light supplied by the backlight unit.

* * * * *